United States Patent
Guan et al.

(10) Patent No.: US 11,722,144 B2
(45) Date of Patent: Aug. 8, 2023

(54) INTEGRATED TIMING SKEW CALIBRATION WITH DIGITAL DOWN CONVERSION FOR TIME-INTERLEAVED ANALOG-TO-DIGITAL CONVERTER

(71) Applicant: Jariet Technologies, Inc., Redondo Beach, CA (US)

(72) Inventors: Claire Huinan Guan, Irvine, CA (US); Scott R. Powell, Carlsbad, CA (US); Sean Wen Kao, Pleasanton, CA (US); Leo Ghazikhanian, Burbank, CA (US)

(73) Assignee: JARIET TECHNOLOGIES, INC., Redondo Beach, CA (US)

( * ) Notice: Subject to any disclaimer, the term of this patent is extended or adjusted under 35 U.S.C. 154(b) by 0 days.

(21) Appl. No.: 17/364,675

(22) Filed: Jun. 30, 2021

(65) Prior Publication Data
US 2023/0015208 A1    Jan. 19, 2023

(51) Int. Cl.
  *H03M 1/12*    (2006.01)
  *H03M 1/10*    (2006.01)

(52) U.S. Cl.
  CPC ................................ *H03M 1/1009* (2013.01)

(58) Field of Classification Search
  USPC ........................................................ 341/155
  See application file for complete search history.

(56) References Cited

U.S. PATENT DOCUMENTS

| | | | |
|---|---|---|---|
| 7,532,684 B2 | 5/2009 | Tietjen | |
| 8,379,760 B2 * | 2/2013 | Petilli | H03M 3/496 455/114.1 |
| 8,654,000 B2 | 2/2014 | Waltari | |
| 2010/0022204 A1 * | 1/2010 | Rofougaran | H01P 1/20372 455/121 |
| 2012/0310601 A1 * | 12/2012 | Martin | H03H 17/0621 702/189 |
| 2015/0091745 A1 * | 4/2015 | Pagnanelli | H03M 3/468 341/143 |
| 2015/0153441 A1 * | 6/2015 | Lapat | G01S 7/285 342/175 |
| 2016/0216295 A1 | 7/2016 | Knierim et al. | |
| 2019/0013795 A1 * | 1/2019 | Tangudu | H03H 11/1204 |

OTHER PUBLICATIONS

Extended European Search Report of Application No. 22181851.1, dated Nov. 28, 2022, 9 pages.

* cited by examiner

*Primary Examiner* — Jean B Jeanglaude
(74) *Attorney, Agent, or Firm* — Morgan, Lewis & Bockius LLP

(57) ABSTRACT

An interleaved analog-to-digital conversion (ADC) system may have timing errors in a time domain that is corrected using phase compensation in a phase domain. The ADC system may include sub-ADCs, each receiving a clock signal, which is associated with a representation of a timing skew value, reflecting an undesired timing error. A mixer may have sub-mixers, each receiving a sub-ADC output signal and a compensated numerically controlled oscillator (NCO) value. A combiner may combine the sub-mixer output signals. A decimator may decimate the output of the combiner. Each timing skew value is in a time domain. A compensated NCO value is determined using a respective phase skew value. Each phase skew value is an offset value in phase and is not a value in time. Each phase skew value in a phase domain compensates the respective timing skew value in a time domain. Multiple ADC systems and methods are described.

18 Claims, 10 Drawing Sheets

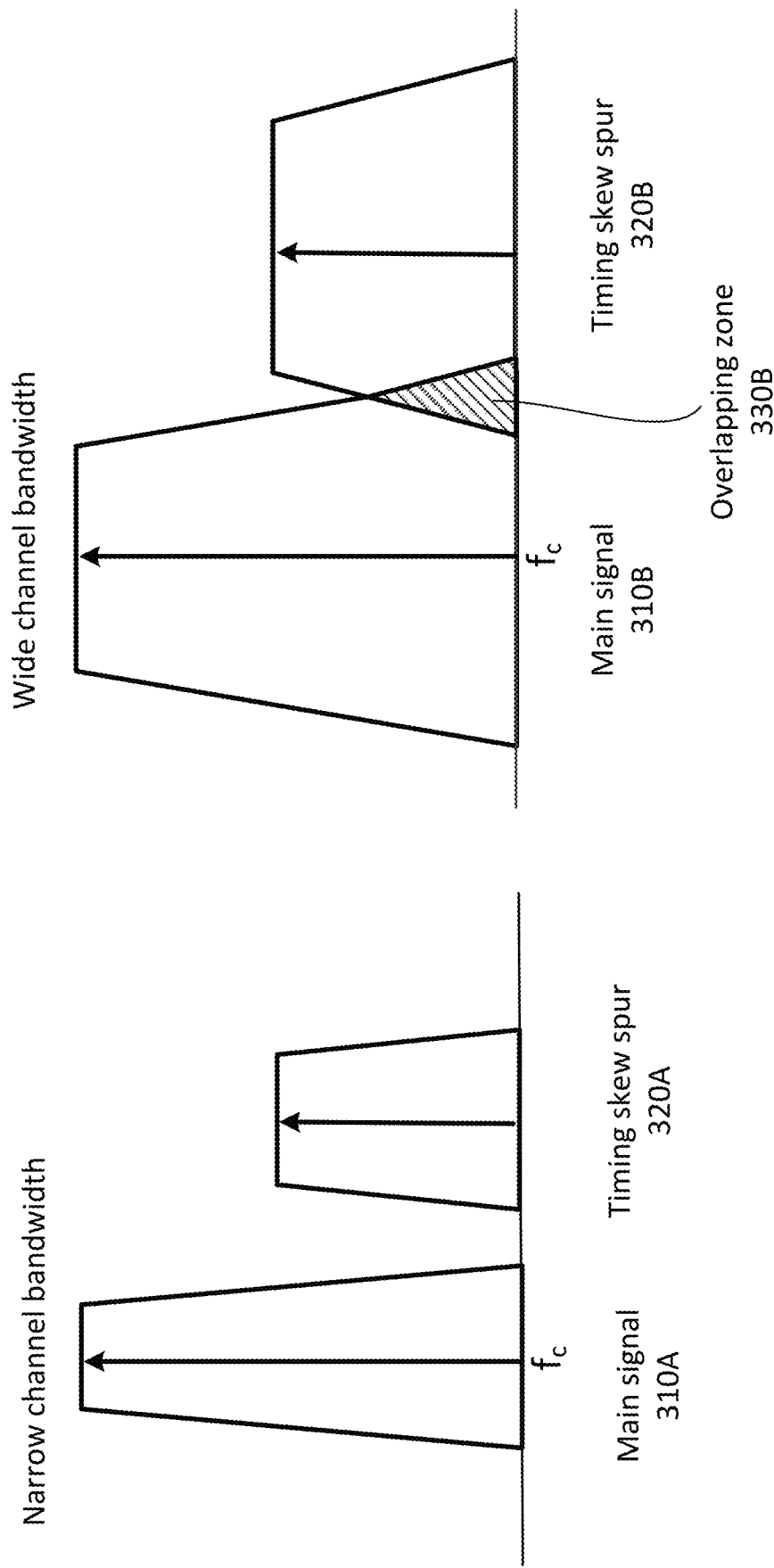

FIG. 6A
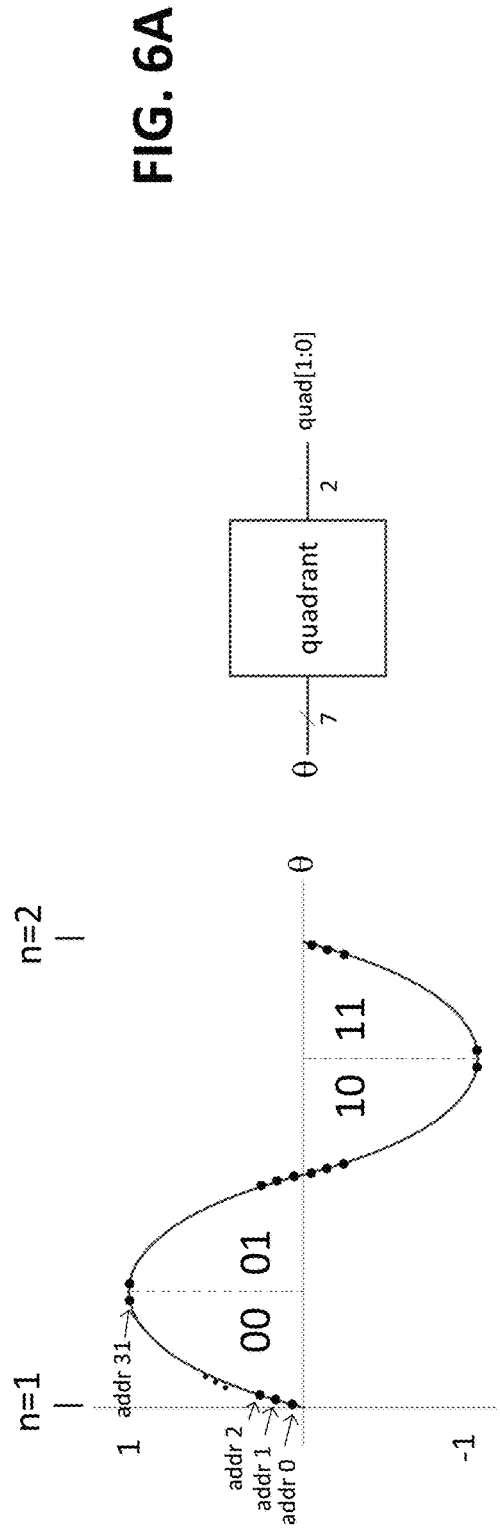
FIG. 6B
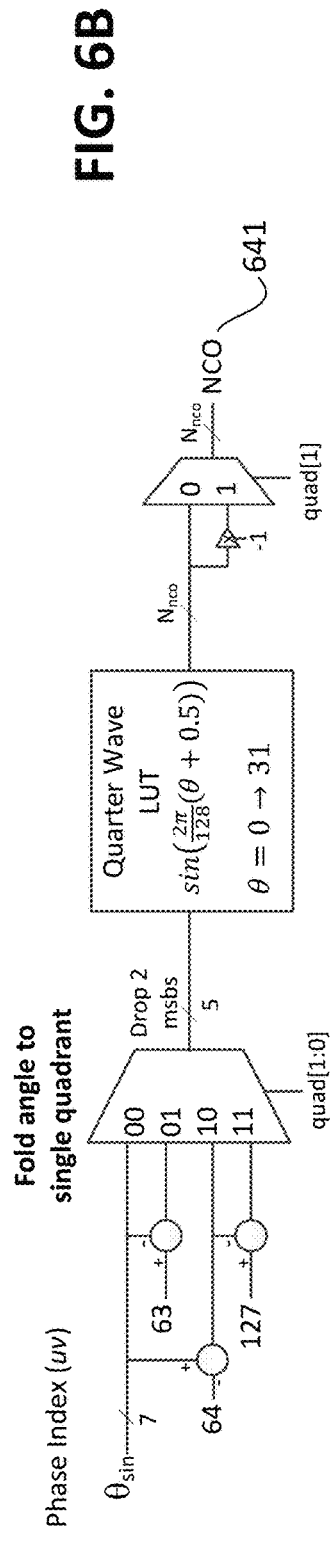
FIG. 6C
$$\sin(2\pi \tfrac{f}{F_s} u) \rightarrow \sin\left(\tfrac{2\pi}{128}(uv)\right)$$
$uv$ = phase increment
$$f = \tfrac{v}{128} F_s$$

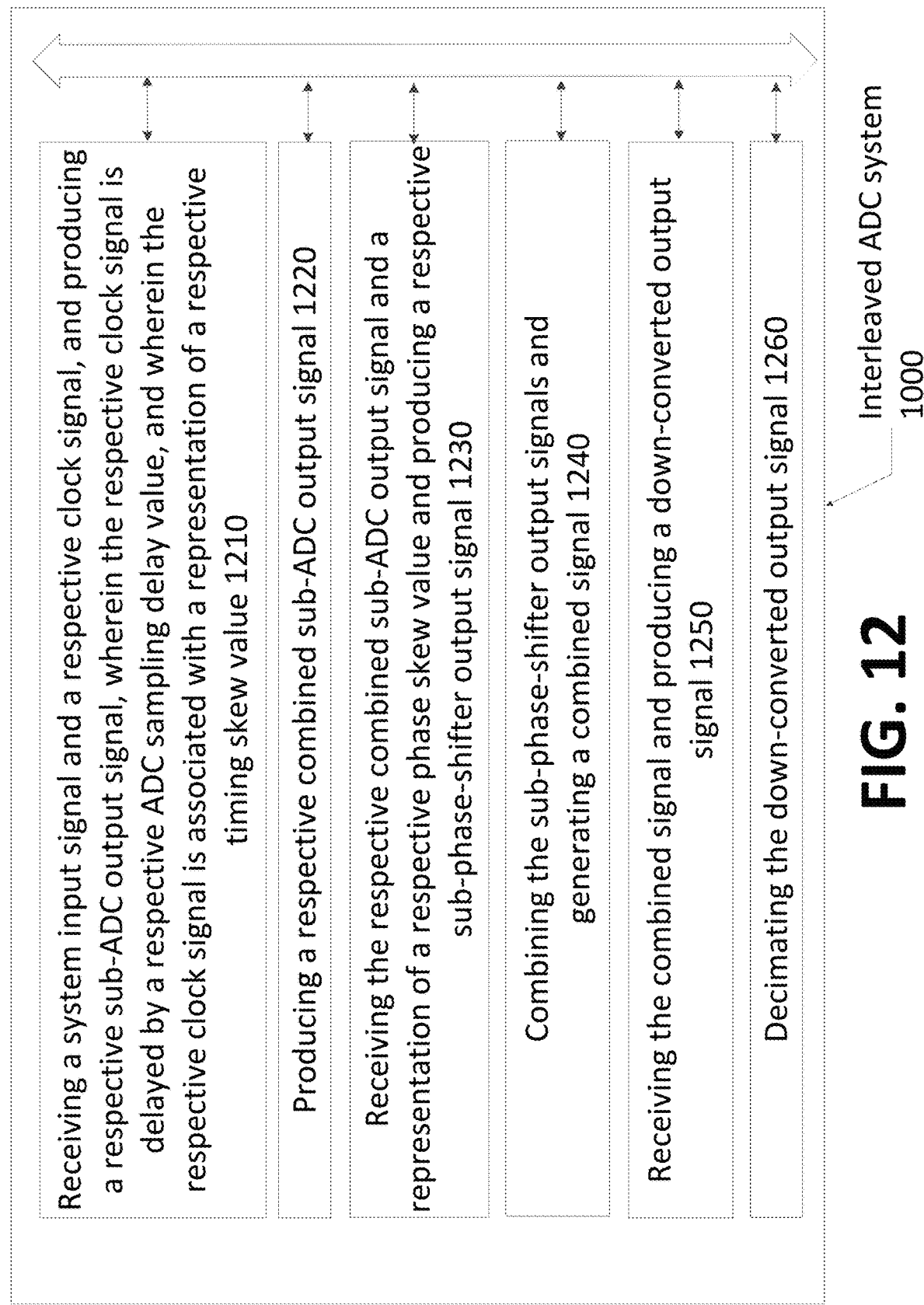

INTEGRATED TIMING SKEW CALIBRATION WITH DIGITAL DOWN CONVERSION FOR TIME-INTERLEAVED ANALOG-TO-DIGITAL CONVERTER

TECHNICAL FIELD

The present description relates in general to analog-to-digital conversion, and more particularly to, for example, without limitation, integrated timing skew calibration with digital down conversion for a time-interleaved analog-to-digital converter.

BRIEF DESCRIPTION OF THE DRAWINGS

FIGS. 3A and 3B illustrate examples of two modulated signals.

FIGS. 6A, 6B and 6C illustrate an example system and method for determining ideal numerically controlled oscillator (NCO) values.

FIG. 12 illustrates another example method for correcting timing skew errors using phase compensation.

Figure 1:
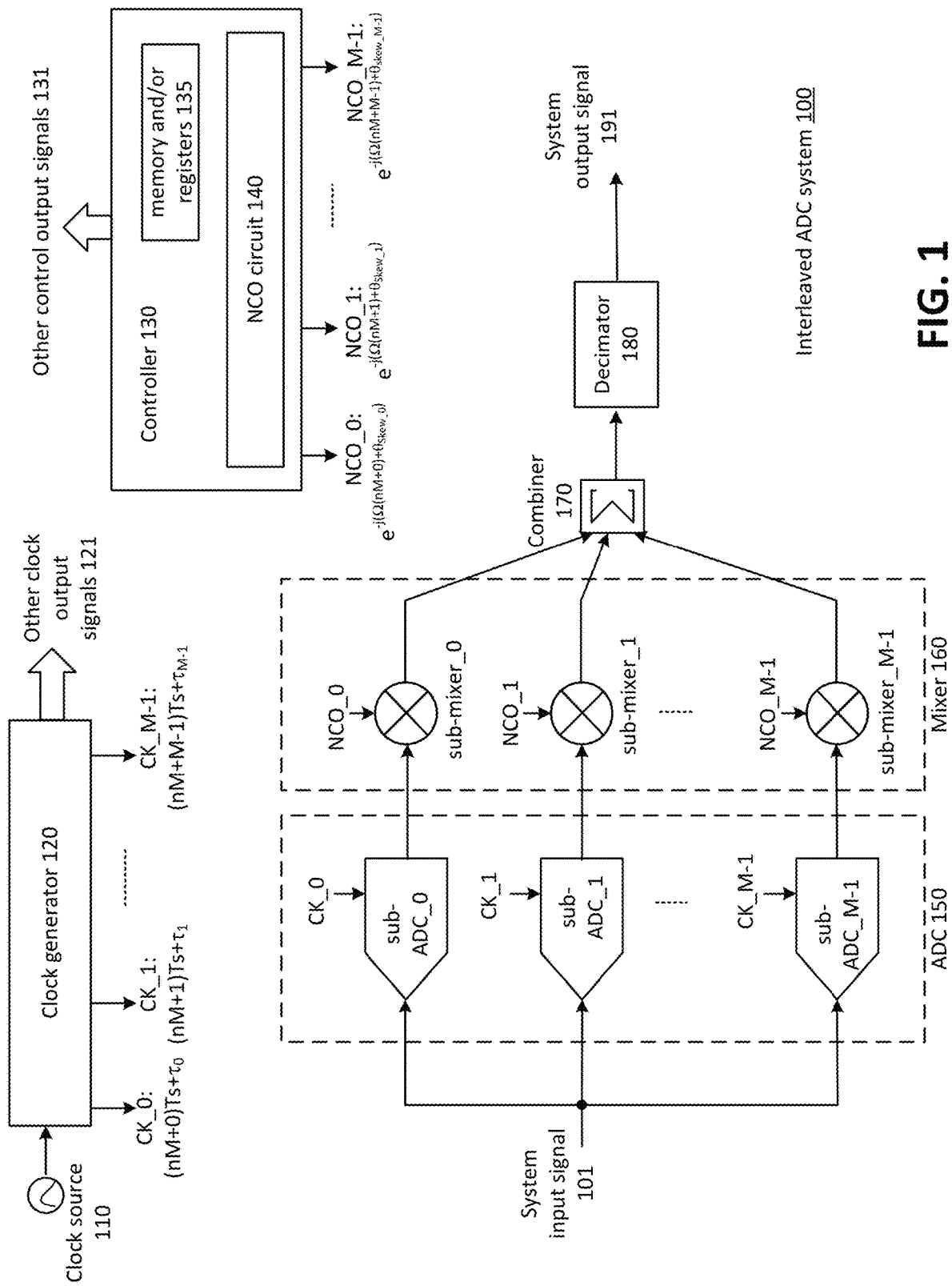
FIG. 1 illustrates an example interleaved analog-to-digital converter (ADC) system.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

A time-interleaved analog-to-digital converter (ADC) may be a prime solution for a high-speed low-power implementation of an ADC system. The performance of a time-interleaved ADC may depend on reliable and accurate compensation of gain mismatches, offset mismatches and timing skew mismatches among the sub-ADCs (or ADC slices). In one or more implementations, an accurate error estimate and compensation, as well as fast convergent algorithms are key factors to achieve high performance interleaved ADCs. Among the mismatches, timing skew errors introduce significant performance issues, and the subject disclosure provides detailed descriptions directed to timing skew compensation, which performs timing error correction by post processing the ADC output signals in digital domain. While tuning a clock time delay may produce a direct compensation on timing error, analog-domain hardware limits the tuning resolution in practical implementations. On the other hand, digital timing skew correction can achieve better resolution. However, it usually requires additional digital blocks that tend to be power hungry. It is thus desirable to create a compensation scheme that is low in power and complexity, while maintaining high accuracy in the compensation result.

One commonly used timing skew calibration technique resolves the timing error by maximizing the data correlation between sub-ADCs (or ADC slices). This scheme assumes the input data wide-sense-stationary. It may be sometimes used to calibrate signals with random signature, but it does not accurately calibrate signals with repeated pattern or changing statistics. The timing skew compensation is usually performed to directly adjust or correct the sampling clock. Another approach is performed by inputting a known continuous wave test signal, and deriving a phase skew by comparing the phase increment among the sub-ADCs (or ADC slices). When Hilbert transformed into an analytical signal, the phase content of an ADC real signal may be revealed and phase compensation can be applied. However, an extensive Hilbert filter set is required to implement this scheme in digital domain on the ADC output signals. Accordingly, these schemes are not desirable for high performance interleaved ADCs.

In one or more implementations of the subject technology, a timing skew correction function is integrated within the signal down-conversion block using a numerically controlled oscillator (NCO). A timing offset at a single frequency is indistinguishable from a phase offset at that frequency. A static phase adjustment of a local oscillator of the NCO can accurately compensate a timing offset at a single frequency. Partial compensation can be achieved within a local bandwidth of the single frequency. In one or more implementations, the phase skew correction is added to the NCO values (or NCO frequency codes) that are programmed for the down-conversion mixers. Without adding physical hardware blocks, implementations of the subject technology results in close to zero power penalty when the timing offset is static. When the timing offset is dynamic but small, a small angle approximation technique is provided to reduce the complexity of dynamic updates to the NCO values (or NCO frequency codes). A discrete Fourier transform (DFT) based phase error estimation and compensation can correct the signal close in spectrum with high accuracy. In one or more implementations, the compensation is applied to the sub-ADC output signals in real domain; hence, half of the timing skew spurs are suppressed, while the other half of spurs are 6 dB worse. However, after digital decimation, the useful signal close in spectrum is free of timing skew spurs.

Highly accurate tuning of timing offsets in time-interleaved ADCs cannot be accomplished using analog techniques. Digital processing offers superior accuracy. However, traditional approaches to digital implementations of pure time delays require complex implementations with large power consumption (e.g., requiring Farrow filters or fractional sample delay filters). In one or more implementations, the subject technology makes dual-use of existing digital functions in a digital down-converter (DDC) based receiver (e.g., an NCO and its associated signal multiplication). In one or more implementations of the subject technology, because hardware already exist as part of the DDC function, there is little or no increase in area or power required to perform timing skew compensation of time-interleaved ADCs within a decimated down-converted band. Further, with respect to dynamic compensation of timing offsets that require computation of sine and cosine functions, one or more implementations of the subject technology uses a simplified approximation to enable adaptive compensation of timing offsets without the need for sine or cosine computations with minimal hardware overhead.

Interleaved Analog-to-Digital Converter (ADC) System

FIG. 1 illustrates an example of an interleaved analog-to-digital converter (ADC) system. An interleaved ADC system 100 may include an ADC 150 and a mixer 160 (e.g., a digital mixer). The ADC 150 may include sub-ADCs (e.g., sub-ADC_0, sub-ADC_1, . . . , and sub-ADC_M−1). The sub-ADCs may be arranged in parallel. The mixer 160 may include sub-mixers (e.g., sub-mixer_0, sub-mixer_1, . . . , and sub-mixer_M−1). The sub-mixers may be arranged in parallel. Each sub-mixer may be coupled to a respective sub-ADC. The interleaved ADC system 100 may also include a clock generator 120 (e.g., a multiphase clock generator). The interleaved ADC system 100 may also include a controller 130, which may include a numerically controlled oscillator (NCO) circuit 140. An NCO of the NCO circuit 140 may be a digital clock generator that creates one or more periodic output signals, each of which can be used as a local oscillator for a respective sub-mixer of the mixer 160. The controller 130 may include one or more controllers. A controller may include one or more processors or microprocessors. The controller 130 (or the NCO circuit 1040) may generate various NCO values and may also generate other control output signals 131 that may be used to control various components shown in FIG. 1. The interleaved ADC system 100 may also include a combiner 170 and a decimator 180. The combiner 170 may combine the interleaved output signals of the sub-mixers. The decimator 180 may downsample the output signal of the combiner 170, for example, by a factor of 16.

Clock Generator

The clock generator 120 may receive a clock signal from a clock source 110. In one or more configurations, all components of the interleaved ADC system 100 (e.g., 120, 130, 140, 150, 160, 170 and 180) use clock signals derived from a single clock source (e.g., the clock source 110), not from multiple clock sources. In one or more examples, it is critical to use a single clock source, rather than multiple clock sources, as the use of a single clock source can minimize timing errors among the components within the interleaved ADC system 100. The clock generator 120 may produce the clock signals for the sub-ADCs (e.g., CK_0, CK_1, . . . , and CK_M−1). The clock generator 120 may produce other clock signals 121 that may be applied to other components (e.g., 130, 140, 160, 170 and 180) of the interleaved ADC system 100.

Timing Diagram of Clock Signals

Figure 2:
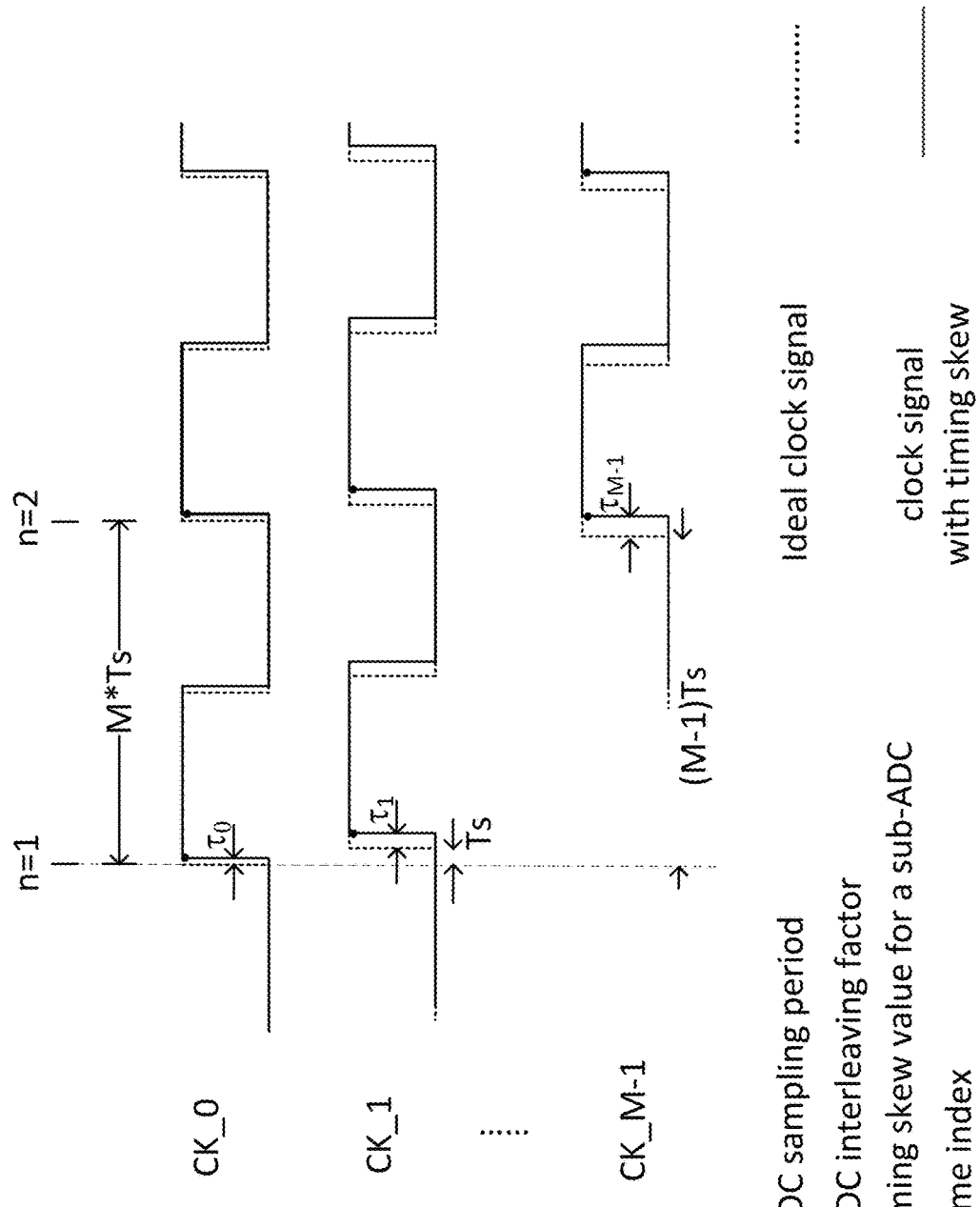
FIG. 2 illustrates an example timing diagram of a representation of clock signals for sub-ADCs.

FIG. 2 illustrates an example of a timing diagram of the clock signals for the sub-ADCs. The horizontal axis of the timing diagram represents time, and the vertical axis of the timing diagram represents an amplitude of the respective clock signal. Ideal clock signals without timing skew are shown using dotted lines. A representation of clock signals with timing skew are shown using solid lines. As shown in FIG. 2, a period of each clock signal is M*Ts. Ts is an ADC sampling period. M is an ADC interleaving factor. The τ symbol τ (e.g., $\tau_0, \tau_1, \ldots,$ or $\tau_{M-1}$) is a timing skew value for a respective sub-ADC. The symbol n is a time index.

Referring to FIGS. 1 and 2, for each sub-ADC (or each ADC slice), the clock generator 120 may produce a respective clock signal. For each sub-ADC, the clock generator 120 may delay the respective ideal clock signal by its respective ADC sampling delay value (see, e.g., a dotted line with a time delay of 0, Ts, . . . , or (M−1)Ts). For CK_1, the ADC sampling delay value is 0*Ts (or zero). For CK_1, the ADC sampling delay value is 1*Ts (or Ts). For CK_M−1, the ADC sampling delay value is M−1*Ts (or (M−1)Ts). This allows the sampling instant of each sub-ADC (excluding the first sub-ADC) to be delayed by one ADC sampling period (Ts) from a preceding sub-ADC.

The ideal clock signals for the sub-ADCs generated by the clock generator 120 may be represented by the dotted lines in FIG. 2. However, the clock signals for the sub-ADCs may be misaligned or mismatched among themselves. This may result in timing skew in the sub-ADC output signals. This resulting timing skew can be represented back into the clock signals using timing skew values (τ's) for the purpose of showing timing errors occurring at the output of the sub-ADCs. Accordingly, for each sub-ADC, in addition to a respective clock signal being delayed by a respective ADC sampling delay value (e.g., 0, Ts, . . . , or (M−1)Ts), as described in the previous paragraph, the respective clock signal may be associated with a representation of a respective timing skew value. For example, each clock signal may be represented as a signal further shifted by a respective timing skew value (e.g., $\tau_0, \tau_1, \ldots,$ or $\tau_{M-1}$) in order to reflect the timing error occurring at the sub-ADCs. While the respective ADC sampling delay value may be intentionally generated by the clock generator 120 to interleave the clock signals into the ADC 150, the respective timing skew value is not intentionally generated by the clock generator 120. The respective timing skew value is a representation of the resulting timing skew that may be produced in the respective sub-ADC output signal. In other words, a respective timing skew value reflects an undesired timing error occurring at the respective sub-ADC (or in the respective sub-ADC output signal). Each timing skew value is a value in time. Each timing skew value is a value determined and used in a time domain.

For each sub-ADC, a rising edge of a respective clock signal (e.g., CK_0, CK_1, . . . , or CK_M−1) may be represented as occurring at the following time. For the first clock signal (e.g., CK_0), the rising edge of the clock signal may be represented as occurring at (nM+0)Ts+$\tau_0$. For the second clock signal (e.g., CK_1), the rising edge of the clock signal may be represented as occurring at (nM+1)Ts+$\tau_1$. For the last clock signal (e.g., CK_M−1), the rising edge of the clock signal may be represented as occurring at (nM+M−1)Ts+$\tau_{m-1}$. In these examples, each clock signal is illustrated with its respective ADC sampling delay value (e.g., 0, Ts, . . . , or (M−1)Ts) and a representation of its respective timing skew value (e.g., $\tau_0, \tau_1, \ldots,$ or $\tau_{M-1}$). In one or more examples, the rising edge of a clock signal may be used to trigger sampling of the system input signal 101 at a respective sub-ADC.

Determination of Timing Skew Values

In one or more implementations, each timing skew value may be determined using one or more methods described herein (e.g., the first and second methods described below). In one or more examples, the controller 130 may perform the first and second methods described below. In these methods, the timing skew values may be sometimes referred to as estimated timing skew values.

First Method

According to a first method, the timing skew values are predetermined based on prior observations and/or modeling. The timing skew values may be predetermined before the sub-ADCs receive the system input signal 101. In one example, the timing skew values may be predetermined and stored in a memory or registers (e.g., within the controller 130, within the NCO circuit 140, within the clock generator 120, or elsewhere in the interleaved ADC system 100) before the sub-ADCs receive the system input signal. In response to receiving the system input signal 101 by the interleaved ADC system 100 (or the ADC 150 or the sub-ADCs), the timing skew values may be read and provided to the clock generator 120. For example, the controller 130 may read and provide the timing skew values from a memory or registers and provide them to the clock generator 120. Alternatively, the clock generator 120 may include a memory or registers, store the timing skew values therein, and read the timing skew values from such memory or registers.

Second Method

According to a second method, the timing skew values may be determined (or computed or estimated) as follows. A timing skew value computation (or estimation) using a single-tone discrete Fourier transform (DFT) approach can be applied to a modulated signal. For example, when the system input signal 101 is a modulated signal, having a carrier frequency or a center frequency, $f_c$ (e.g., a frequency between 1 GHz and 50 GHz) and a channel bandwidth, $f_{bw}$ (e.g., a bandwidth between 20 MHz and 3 GHz), then the modulated signal may be treated as a multi-tone signal with concatenated frequency bins. Each frequency bin may, for example, contain one frequency.

FIGS. 3A and 3B illustrate examples of two modulated signals. In these figures, the horizontal axis is a frequency, and the vertical axis is an amplitude. FIG. 3A shows an example of a modulated signal with a narrow channel bandwidth. The modulated signal may have a main signal 310A with a carrier frequency, $f_c$, and a narrow channel bandwidth. The modulated signal may have several timing skew spurs. If an ADC interleaving factor (M) is 16, then there may be 15 spurs and a main frequency. FIG. 3A shows one of the spurs located closest to the main signal 310A, and this spur is shown as the timing skew spur 320A. In FIG. 3A, because the channel bandwidth is narrow, there is no overlapping zone between the main signal 310A and the closest timing skew spur 320A.

FIG. 3B shows an example of a modulated signal with a wide channel bandwidth. The modulated signal may have a main signal 310B with a carrier frequency, $f_c$, and a wide channel bandwidth, which is wider than the channel bandwidth shown in FIG. 3A. The modulated signal may have several timing skew spurs. If an ADC interleaving factor (M) is 16, then there may be 15 spurs and a main frequency. FIG. 3B shows one of the spurs located closest to the main signal 310B, and this spur is shown as the timing skew spur 320B. In FIG. 3B, because the channel bandwidth is wide, there is an overlapping zone 330B between the main signal 310B and the closest timing skew spur 320B.

The second method may determine the computed (or estimated) timing skew values using the following steps: (a) selecting a frequency of the modulated signal that meets certain criteria; (b) determining spurs that may be produced by an ADC (e.g., the ADC 150) for the selected frequency; and (c) performing discrete Fourier transforms (DFTs) on the spurs for the selected frequency and obtaining the computed timing skew values. The term spurs may be sometimes referred to as timing skew spurs, timing skew spur bins or timing skew spur frequency bins and vice versa.

As for step (a), the selected frequency needs to satisfy the following criteria. First, the selected frequency needs to satisfy coherent sampling. This can be met by satisfying the following relationship: $f_{in}/f_s = MC/NS$, equation (1)

where $f_{in} = f_{select}$;

$f_{select}$ = a selected frequency;

$f_s$ = a sampling rate or a sampling frequency;

MC = the number of cycles in a sampled set; MC is an odd number or a prime number; and NS = the number of samples; NS is a power of 2; NS is used in DFTs in step (c).

Second, the selected frequency needs to be within the channel bandwidth of the carrier frequency. For example, the selected frequency needs to be within the carrier frequency +/- one half of the channel bandwidth. As an illustration, if the carrier frequency is 30 GHz, and the channel bandwidth is 200 MHz, then the selected frequency needs to be within 30 GHz +/- 100 MHz (or between 29.900 GHz and 30.100 GHz). Third, the selected frequency must not overlap with any frequencies that may be occupied by the spurs (e.g., 15 spurs produced when M is 16) produced by the ADC for the modulated signal. For example, the selected frequency cannot be in the overlapping zone 330B.

As for step (b), the spurs that may be produced by an ADC (e.g., the ADC 150) for the selected frequency can be determined based on an equation described below. For step (b), the term spurs may refer to spurs and the main frequency. The spurs (including the main frequency) in the first Nyquist zone can be determined using the following equation, and the spurs (including the main frequency) are located at the following frequencies:

$$\frac{f_s}{M} \times p \pm \mathrm{mod}\left(f_{in}, \frac{f_s}{M}\right), \text{ where} \qquad \text{equation (2)}$$

$f_s$ = a sampling rate;

$M$ = an ADC interleaving factor;

$f_{in}$ = a frequency of a system input signal;

$p$ = a non-negative integer and varies from 0 to $\left(\frac{M}{2} - 1\right)$;

e.g. if $M = 16$, then $p = 0, 1, 2, 3, 4, 5, 6,$ and 7, and each of these 8 $p$ values can be inserted into the equation (2); e.g., if $M = 16$, then the equation (2) produces 16 frequencies (e.g., 15 spur frequencies and 1 main frequency) in the first Nyquist zone, as "$p$" has 8 values, and "±mod"

can provide 2 values for each value of $p$; and mod = a modulo operation.

Figure 4:
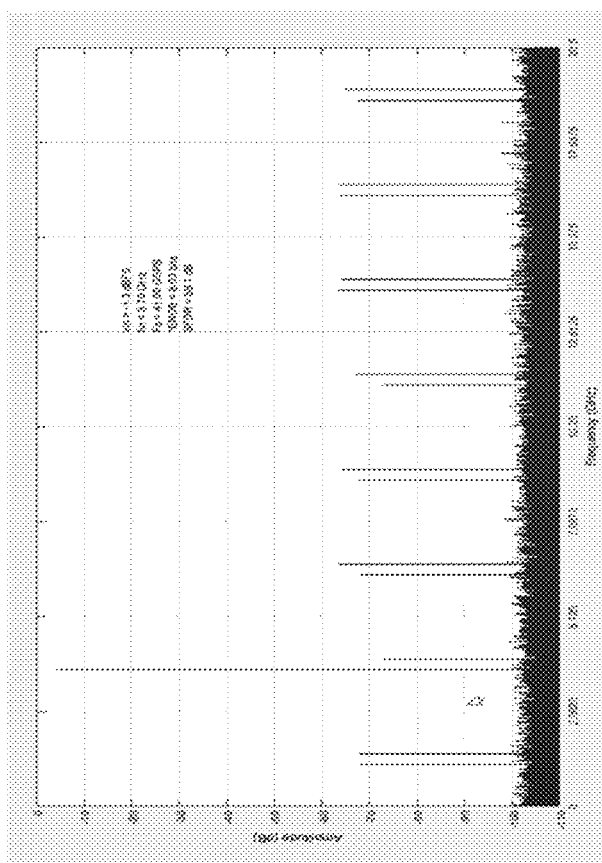
FIG. 4 illustrates an example graph showing a main frequency and spurs.

For a modulated signal for step (b), $f_{in} = f_{select}$ (or the selected frequency). Hence, the spurs (or spur frequencies including the main frequency) are determined, using the selected frequency ($f_{select}$), where $f_{select}$ is used as the frequency of the system input signal ($f_{in}$) in the above equation (2). As an illustration, FIG. 4 shows an example graph showing the spurs (including 15 spurs and a main frequency)

determined using the above equation (2). In this example, the horizontal axis is a frequency, the vertical axis is an amplitude, the selected frequency ($f_{select}$), which is used as $f_{in}$ in the above equation (2), is 3.70 GHz, and $f_s$ is 41 GSPS.

For step (c), DFTs can be performed on the spurs (including the main frequency) determined by step (b). For step (c), the term spurs may refer to spurs and the main frequency. For M=16, the spurs may refer to 15 spurs and 1 main frequency. Performing DFTs on the spurs produce phase skew values. In this examples, there are 16 phase skew values for 16 spurs (e.g., 15 spurs and 1 main frequency). Each phase skew value ($\theta_{Skew\_s}$) is then converted into a respective timing skew value ($\tau_s$) using the following equation:

$$\tau_s = \frac{\theta_{skew\_s}}{(2*\pi*f_{in})},$$

where $f_{in}=f_{select}$. If necessary, an offset value may then be added to each of the timing skew values determined using the foregoing equation for Ts. The offset value may be one constant value (e.g., a positive or negative real number) for all of the timing skew values; hence, the offset value may effectively shift all of the timing skew values by the same amount of the offset value. This offset value may be determined by comparing the timing skew values determined using the foregoing equation against the expected timing skew values. The timing skew values produced according to the steps (a)-(c) may be referred to as the computed timing skew values.

Figure 5:
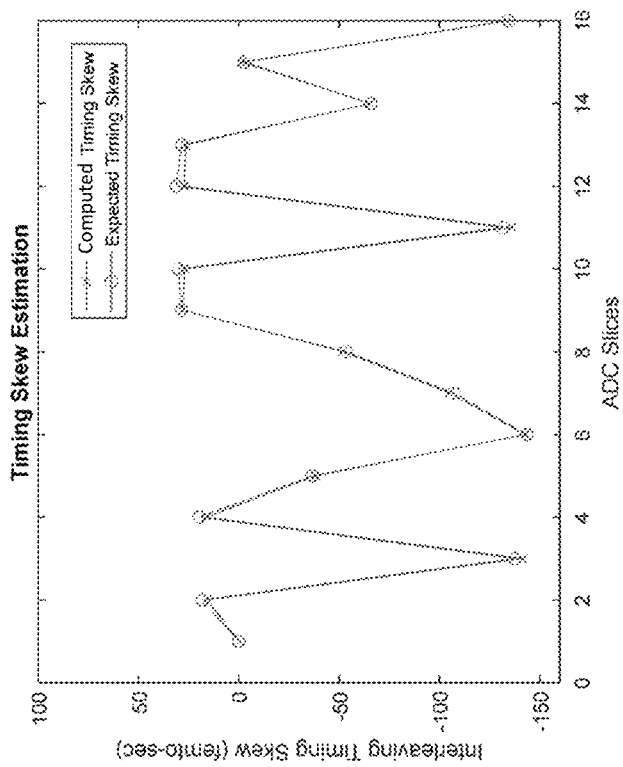
FIG. 5 illustrates an example of computed timing skew values and expected timing skew values.

FIG. 5 illustrates an example of the computed timing skew values (x) and the expected timing skew values (o). In FIG. 5, the horizontal axis represents sub-ADCs (or ADC slices). In this example, M is 16, and there are 16 sub-ADCs. For example, "1" on the horizontal axis may represent sub-ADC_0, and "16" on the horizontal axis may represent sub-ADC_M-1. In FIG. 5, the vertical axis represents the timing skew values in femtoseconds. In this example, the computed timing skew values (x) are determined using the steps (a)-(c) above and are about 0 for sub-ADC_0, about 20 femtoseconds for sub-ADC_1, and about −140 femtoseconds for sub-ADC_2, etc. As illustrated in FIG. 5, the computed timing skew values (x) match the expected timing skew values (o). For the second method, in one or more implementations, only a single frequency is selected and used. That is, even though the modulated signal contains multiple frequencies within the channel bandwidth, only a single frequency is selected and used for the steps (a)-(c) of the second method described above.

ADC with Timing Skew Errors and Mixer with Phase Compensation

Still referring to FIGS. 1 and 2, the sub-ADCs of the ADC 150 are interleaved so that each sub-ADC can run at a lower speed (e.g., $f_s/M$, where $f_s$ is a sampling rate (e.g., 64 GSPS), and M is an ADC interleaving factor (e.g., 16, 64)). Each sub-ADC may receive the system input signal 101 and a respective clock signal (e.g., CK_0, CK_1, . . . , or CK_M−1) and may produce a respective sub-ADC output signal that represents a digital signal.

The clock signals received at the sub-ADCs are not ideal, and the misalignment among the clock signals can create timing screw in the sub-ADC output signals. The misalignment thus can create timing skew spurs at the ADC output spectrum in the sub-ADC output signals. The timing skew spurs in the first Nyquist zone are located at the following frequencies:

$$\frac{f_s}{M} \times p \pm \mathrm{mod}\left(f_{in}, \frac{f_s}{M}\right),$$

where $f_s$=a sampling rate; M= an ADC interleaving factor; $f_{in}$= a frequency of a system input signal; p=a non-negative integer and varies from 0 to $$\left(\frac{M}{2} - 1\right);$$

and mod=a modulo operation.

In some approaches, timing skew is corrected with direct clock delay tuning in an analog domain. However, in one or more implementations of the subject technology, such approaches are not used as they are disadvantageous. In one or more implementations of the subject technology, timing skew may be corrected or compensated by post processing the sub-ADC output signals in a digital domain. In one or more configurations, the sub-mixers of the mixer 160 utilize compensated NCO values (or skewed NCO values) to compensate for the timing skew errors manifested in the sub-ADC output signals. These timing skew errors may be represented as the timing skew values (e.g., $\tau_0, \tau_1, \ldots,$ or $\tau_{m-1}$) for illustrative purposes. The interleaved ADC system 100 may perform timing skew correction using phase compensation in a digital domain (and not using an analog domain compensation or a time domain compensation).

In one or more examples, if a system input signal 101 is a continuous wave signal having a single frequency, then the timing skew and phase compensation may be described as follows. In one aspect, a sub-ADC output signal is a real signal g(t). When a Hilbert transform is performed on a sub-ADC output signal, the result can be an analytic signal expressed as:

$$g_+(t)=g(t)+j\hat{g}(t) \qquad \text{equation (3a)}$$

$$g_-(t)=g(t)-j\hat{g}(t) \qquad \text{equation (3b)}$$

$$g(t)=(g_+(t)+g_-(t))/2 \qquad \text{equation (3c)}$$

For each sub-ADC output signal with timing skew may be represented as:

$$g(t)=A\cos(2\pi f(t+\Delta t))=A(e^{j2\pi f(t+\Delta t)}+e^{-j2\pi f(t+\Delta t)})/2 \qquad \text{equation (3d)}$$

When the above is corrected by phase compensation, the resulting signal may be represented as:

$$g(t)e^{-j2\pi f\Delta t}=(Ae^{j2\pi ft}+Ae^{-j2\pi f(t+2\Delta t)})/2 \qquad \text{equation (3e)}$$

Spur suppressed Spur 6 dB worsened

Here, spur is suppressed in the term ($Ae^{j2\pi ft}$). However, spur is worsened by 6 dB in the term ($Ae^{-j2\pi f\Delta t}$). Thus, the resulting spectrum within $2*f_s/M$ frequency span is free of timing skew spurs.

In the above equations (3a)-(3e),
$f=f_{in}$;

$$\Omega = \frac{2\pi f_{in}}{f_s};$$

$f_{in}$=a frequency of a system input signal;
$f_s$=a sampling rate;
t=nM+s;
$2\pi f_{in}\Delta t = \theta_{Skew\_s}$;
M= an ADC interleaving factor;
s=an ADC index;
n=a time index; and
$\theta_{Skew\_s}$=a phase skew value.

Ideal and Compensated NCO Values

Still referring to FIGS. 1 and 2, similar to the sub-ADCs, the sub-mixers of the mixer 160 are interleaved so that each sub-mixer can run at a lower speed (e.g., $f_s$/M). The mixer 160 may be coupled to the ADC 150. Each sub-mixer (e.g., sub-mixer_0, sub-mixer_1, . . . , or sub-mixer_M–1) may receive the respective sub-ADC output signal and a respective compensated numerically controlled oscillator (NCO) value (e.g., NCO_0, NCO_1, . . . , NCO_M–1), and may produce a respective sub-mixer output signal that may represent a down-converted signal of the respective sub-ADC output signal. The controller 130 (or the NCO circuit 140) may determine the ideal NCO values and the compensated NCO values.

Ideal NCO Values

An ideal NCO value for each sub-mixer may be represented as $e^{-j\Omega(nM+s)}$, which may be represented as $NCOI_{nm+s}+jNCOQ_{nm+s}$. For example, an ideal NCO value for the first sub-mixer (e.g., sub-mixer_0) may be $NCOI_{nm+0}+jNCOQ_{nm+0}$. An ideal NCO value for the second sub-mixer (e.g., sub-mixer_1) may be $NCOI_{nm+1}+jNCOQ_{nm+1}$. An ideal NCO value for the last sub-mixer (e.g., sub-mixer_M–1) may be $NCOI_{nm+m-1}+jNCOQ_{nm+m-1}$. An ideal NCO value has two components: a real component ($NCOI_{nm+s}$) and an imaginary component ($NCOQ_{nm+s}$). Each value of $NCOI_{nM+s}$ and $NCOQ_{nm+s}$ may be a real number. The ideal NCO value ($NCOI_{nm+s}+jNCOQ_{nm+s}$) may be a complex number. In one or more examples, an ideal NCO value (e.g., $e^{-j\Omega(nM+s)}$) may reflect a representation of an oscillator value (e.g., a representation of a local oscillator value or a representation of a frequency value), without being based on or including a phase value or a representation of a phase value (e.g., a representation of a phase skew value; e.g., a phase shift value).

In one or more implementations, the controller 130 (e.g., the NCO circuit 140) may predetermine and store ideal NCO values, and this may occur before the sub-ADCs receive the system input signal 101. FIGS. 6A, 6B and 6C illustrate an example system and method for determining the ideal NCO values, by the controller 130 (or the NCO circuit 140), using a look-up table. The graph in FIG. 6A (the left portion of FIG. 6A) illustrates an example cycle of a continuous wave signal. The signal is shown with four quadrants as indicated with 00, 01, 10 and 11. In this example, each quadrant is shown with 32 values (see, e.g., addr 0, addr 1, . . . , and addr 31). The block diagram in FIG. 6A (the right portion of FIG. 6A) illustrates a method of determining a quadrant of a phase (θ). A diagram in FIG. 6B illustrates an example block diagram of a configuration within the controller 130 (or the NCO circuit 140) that can generate ideal NCO values 641. The configuration (e.g., an NCO) may include, among others, a first mux, a quarter wave look-up table, and a second mux. The first mux may receive a phase index (uv) and produce a value for a single quadrant. Using the phase index and the first mux, a phase (θ) may be folded into a single quadrant. The controller 130 (or the NCO circuit 140) may read a corresponding value from the quarter wave look-up table (that contains ideal NCO values for a single quadrant). The secondo mux in the controller 130 (or the NCO circuit 140) may produce an ideal NCO value 641 based on the value read from the look-up table. The diagram and the notations in FIG. 6C illustrate a method of determining the phase index (or phase increments).

In one or more implementations, the controller 130 (or the NCO circuit 140) may perform the method of determining ideal NCO values described with respect to FIGS. 6A, 6B and 6C. The controller 130 (or the NCO circuit 140) may store the ideal NCO values, for example, in the NCO circuit 140 or the memory and/or registers 135 shown in FIG. 1.

In FIGS. 6A-6C, in one or more implementations, $f = f_{in}; Fs = f_s;$ and

θ is $\Omega(nM+s)$, where $$\Omega = \frac{2\pi f_{in}}{f_s};$$

$f_{in}$=a frequency or a system input signal; $f_s$=a sampling rate; M= an ADC interleaving factor; s=an ADC index; n=a time index; and a notation indicate the number of bits carried by the signal line.

Still referring to FIGS. 6A-6C, in one example, the method may utilize 16 interleaved time planes in an analog ADC domain. The NCO circuit (e.g., 140) may have a 2π/128 phase resolution. The NCO circuit may store a quarter wave and output (1023/1024)sin(θ). It may maintain a single integer bit after multiplication. In this example, $N_{nco}$=15 bits (14 fractional). Each time plane may be bounded to 8 look-up table (LUT) indexes in the NCO. In one or more examples, the timing skew errors may be compensated directly using the NCO LUT entries together with phase skew values in phase. In one or more examples, the quarter wave LUT in FIG. 6B stores the ideal NCO values for a single quadrant only. This may occur before the system input signal is received by the sub-ADCs. Having the ideal NCO values, for one quadrant, predetermined and pre-stored can help expedite processing. The controller 130 (or the NCO circuit 140) can determine the ideal NCO values for the remaining three quadrants in real time using the ideal NCO values stored for the single quadrant. As the values for the remaining three quadrants are simply mirrored values of one quadrant (e.g., mirrored around a horizontal line or a vertical line), the controller 130 (or the NCO circuit 140) can determine the values for the remaining three quadrants quickly in real time as needed. The interleaved ADC system 100 thus does not need to pre-store the ideal NCO values for the remaining three quadrants. The blocks illustrated in FIGS. 6A-6C may be used to determine $NCOI_{nm+s}$, and the NCO output 641 may represent $NCOI_{nm+s}$. Another set of blocks similar to those shown in FIGS. 6A-6C (or a subset thereof) may be used to determine $NCOQ_{nm+s}$. The blocks illustrated in FIGS. 6A-6C may be implemented in hardware or a combination or hardware and software (or firmware). The blocks illustrated in FIGS. 6A-6C may be implemented in the controller 130 (e.g., the NCO circuit 140). The subject technology is not limited to the system and method shown in FIGS. 6A-6C, and the ideal NCO values may be determined using other known methods.

Compensated NCO Values

The controller 130 (or the NCO circuit 140) may determine the compensated NCO values. A compensated NCO value for each sub-mixer may be represented as $e^{-j(\Omega(nM+s)+\theta_{Skew\_s})}$. For example, a compensated NCO value for the first sub-mixer (e.g., sub-mixer_0) may be $e^{-j(\Omega(nM+s)+\theta_{Skew\_0})}$. A compensated NCO value for the second sub-mixer (e.g., sub-mixer_1) may be $e^{-j(\Omega(nM+s)+\theta_{Skew\_1})}$. A compensated NCO value for the last sub-mixer (e.g., sub-mixer_M-1) may be $e^{-j(\Omega(nM+s)+\theta_{Skew\_M-1})}$.

A compensated NCO value for each sub-mixer may be represented as below:

$$e^{-j(\Omega(nM+s)+\theta_{Skew\_s})} = e^{-j\Omega(nM+s)} * e^{-j\theta_{Skew\_s}} = e^{-j\Omega(nm+s)} *$$
$$[\cos(\theta_{Skew\_s}) + j\sin(\theta_{Skew\_s})] = [NCOI_{nM+s}*\cos(\theta_{Skew\_s}) - NCOQ_{nm+s}*\sin(\theta_{Skew\_s})] +$$
$$j[NCOQ_{nM+s}*\cos(\theta_{Skew\_s}) + NCOI_{nm+s}*\sin(\theta_{Skew\_s})];$$

When $\theta_{Skew\_s}$ is small, then a small angle approximation technique can be used as follows:

$\cos(\theta_{Skew\_s}) \approx 1$ and $\sin(\theta_{Skew\_s}) \approx \theta_{Skew\_s}$;

$NCOI'_{nm+s} \approx [NCOI_{nm+s} - \theta_{Skew\_s}*NCOQ_{nM+s}]$; and $NCOQ'_{nm+s}[NCOQ_{nm+s} + \theta_{Skew\_s}*NCOI_{nm+s}]$, where the sign $\approx$ indicates that these are approximately equal, and in one or more examples, the sign $\approx$ can be substituted by an equal sign =.

Thus, when $\theta_{Skew\_s}$ is small (e.g., 2 or 3 degrees), a compensated NCO value for each sub-mixer may be represented as $NCOI'_{nm+s} + jNCOQ'_{nm+s}$.

In one or more implementations, the notations used for the ideal NCO values and the compensated NCO values in the above equations may be described as follows:

$$\Omega = \frac{2\pi f_{in}}{f_s};$$

$2\pi f_{in} = 2*\pi*f_{in}$;
$f_{in}$ = a frequency of a system input signal;
n = a time index (e.g., a non-negative integer);
M = an ADC interleaving factor;
s = an ADC index; for example, s may be a non-negative integer between 0 and M-1;
  for example, s may be 0, 1, . . . , or M-1; in one example, a mixer index is an ADC index; and
$\theta_{Skew\_s}$ = a phase skew value for each sub-mixer; for example, a phase skew value for
  the first sub-mixer (e.g., sub-mixer_0) may be $\theta_{Skew\_0}$. A phase skew value for
  the second sub-mixer (e.g., sub-mixer_1) may be $\theta_{skew\_1}$. A phase skew value
  for the last sub-mixer (e.g., sub-mixer_M-1) may be $\theta_{Skew\_m-1}$.

For each sub-mixer of the mixer 160 in FIG. 1, the respective compensated NCO value may be determined using (i) a respective ideal NCO value (e.g., $e^{-j\Omega(nM+s)}$) and (ii) a representation of a respective phase skew value ($e^{-j\theta_{Skew\_s}}$). In one or more examples, each compensated NCO value has a frequency component and a phase component, where an ideal NCO value provides the frequency component, and a representation of a respective phase skew value provides the phase component. In FIG. 1, $$\Omega = \frac{2\pi f_{in}}{f_s}.$$

Each skew value ($\theta_{Skew\_s}$) is an offset value in phase and is not a value in time. Each phase skew value ($\theta_{Skew\_s}$) may be determined based on the respective timing skew value (e.g., $\tau_s$, where $\tau_s$ is $\tau_0, \tau_1, \ldots,$ or $\tau_{M-1}$). The respective phase skew value, for each sub-mixer of the mixer 160, may compensate the respective timing skew value of the respective sub-ADC of the ADC 150. In one or more implementations, each phase skew value ($\theta_{Skew\_s}$) = $2\pi*f_{in}*\tau_s$, where $f_{in}$ = a frequency of a system input signal, and $\tau_s$ is a timing skew value for a respective sub-ADC. For example, $\tau_s = \tau_0$, $\tau_1, \ldots,$ or $\tau_{M-1}$.

The controller 130 (or the NCO circuit 140) may determine the compensated NCO values based on the ideal NCO values (e.g., $e^{-j\Omega(nM+s)} = NCOI_{nm+s} + jNCOQ_{nm+s}$) and the phase skew values ($e^{-j\theta_{Skew\_s}}$). As described above, a compensated NCO value for each sub-mixer may be represented as $NCOI'_{nM+s} + jNCOQ'_{nM+s}$, where $NCOI'_{nM+s} = [NCOI_{nM+s} - \theta_{Skew\_s}*NCOQ_{nm+s}]$, and $NCOQ'_{nm+s} = [NCOQ_{nm+s} + \theta_{Skew\_s}*NCOI_{nm+s}]$, when $\theta_{Skew\_s}$ is small. The controller 130 (or the NCO circuit 140) may read the pre-stored ideal NCO values ($NCOI_{nm+s}$ and $NCOQ_{nm+s}$) for a single quadrant, may compute the ideal NCO values for another quadrant (if the relevant quadrant is another quadrant), and may then multiply the relevant $\theta_{Skew\_s}$, as shown in the above equation. When $\theta_{Skew\_s}$ is small, $\cos(\theta_{Skew\_s})$ can be approximated to 1, and $\sin(\theta_{Skew\_s})$ can be approximated to $\theta_{Skew\_s}$. Hence, the computation of the compensated NCO values do not require computing cosine and sine functions that are computation-intensive and time-consuming. Accordingly, in the subject technology, the controller 130 (or the NCO circuit 140) can determine the compensated NCO values expeditiously in real time without causing any significant delay.

For a modulated signal with a channel bandwidth (e.g., the modulated signals illustrated in FIGS. 3A and 3B) where only a single frequency ($f_{select}$) is selected according to the second method described above, this can create an error in the phase skew values. For each sub-mixer, the maximum error for a respective phase skew value ($\max(\theta_{err\_s})$) may be expressed as follows:

$$\max(\theta_{err\_s}) = \theta_{skew\_s} \frac{f_{bw}}{2f_c},$$

where
$f_{bw}$, = a channel bandwidth;
$f_c$ = a carrier frequency of the modulated signal;
$\theta_{Skew\_s}$ = a phase skew value; and
s = an ADC index; e.g., s can be between 0 and M-1.

For example, if $f_c$ is 30 GHz, $f_{bw}$ is 200 MHz, and $\theta_{Skew\_1}$ is 2 degrees, then the maximum error for this phase skew value ($\theta_{Skew\_1}$) is about 0.007 degrees. Hence, the maximum error is relatively small, and the subject technology can compensate for timing skew errors with minimum phase errors.

Example Graphs of Timing Skew Correction on Modulated Signals

FIGS. 7, 8A, 8B, 9A and 9B illustrate examples of output signals where a system input signal 101 is a modulated signal. In these examples, $f_s$ = a sampling rate = 64 GSPS; $f_{in}$ = a frequency of a system input signal (e.g., the carrier frequency) = 26.9 GHz; M = an ADC interleaving factor = 16; the signal is a QPSK modulated signal with a channel bandwidth of 200 MHz; and a digital decimation by a factor of 16 is used. In FIGS. 7, 8A, 8B, 9A and 9B, the horizontal axis is a frequency (in GHz), and the vertical axis is an amplitude (in dB).

Figure 7:
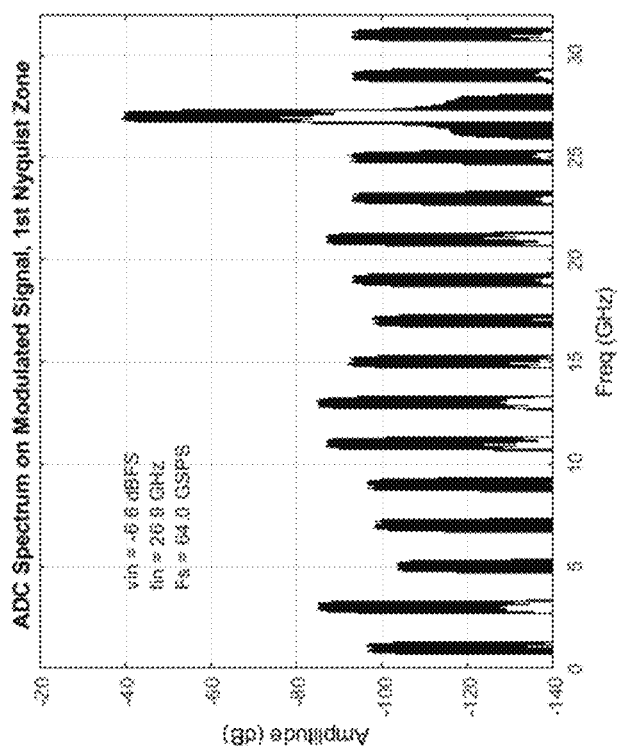
FIGS. 7, 8A, 8B, 9A and 9B illustrate examples of output signals where a system input signal is a modulated signal.
Figure 8B:
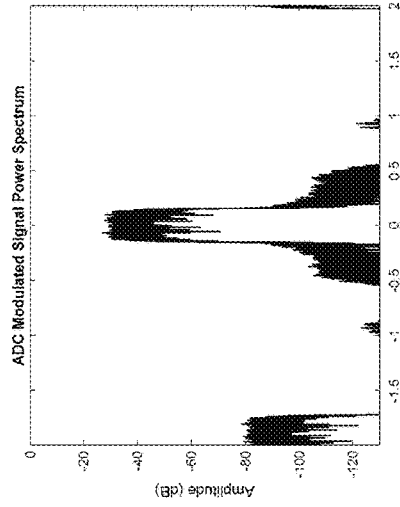
Figure 9B:
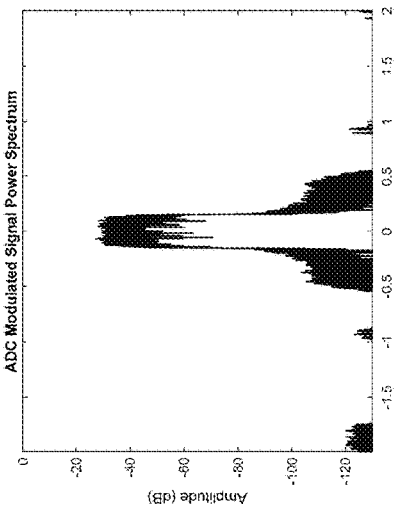
Figure 8A:
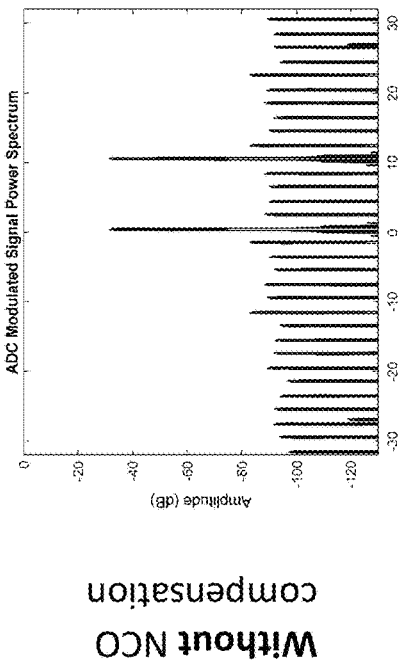
Figure 9A:
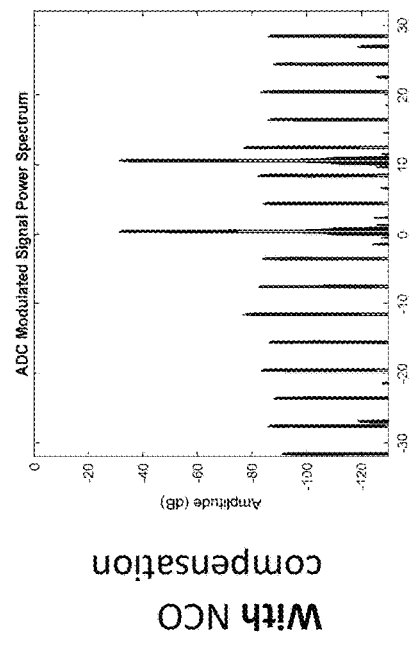

FIG. 7 illustrates example digital output signals of all sub-ADCs of the ADC 150. The graph illustrates example output signals of the modulated signal having one main signal (at 26.9 GHz) and 15 timing skew spurs in the full Nyquist spectrum. FIGS. 8A and 8B illustrate example output signals of the modulated signal without NCO phase compensation (e.g., using ideal NCO values of)$)e^{-j\Omega(nM+0)}$). FIG. 8A illustrates an example output signal of the combiner 170, and FIG. 8B illustrates an example output signal of the decimator 180. FIGS. 9A and 9B illustrate example output signals of the modulate signal with NCO phase compensation (e.g., using compensated NCO values of $e^{-j(\Omega(nM+0)+\theta Skew\_s)}$). FIG. 9A illustrates an example output signal of the combiner 170, and FIG. 9B illustrates an example output signal of the decimator 180. Comparing FIGS. 8A and 8B with FIGS. 9A and 9B, the output signals shown in FIGS. 9A and 9B clearly illustrate compensation of the timing skew errors.

Figure 10:
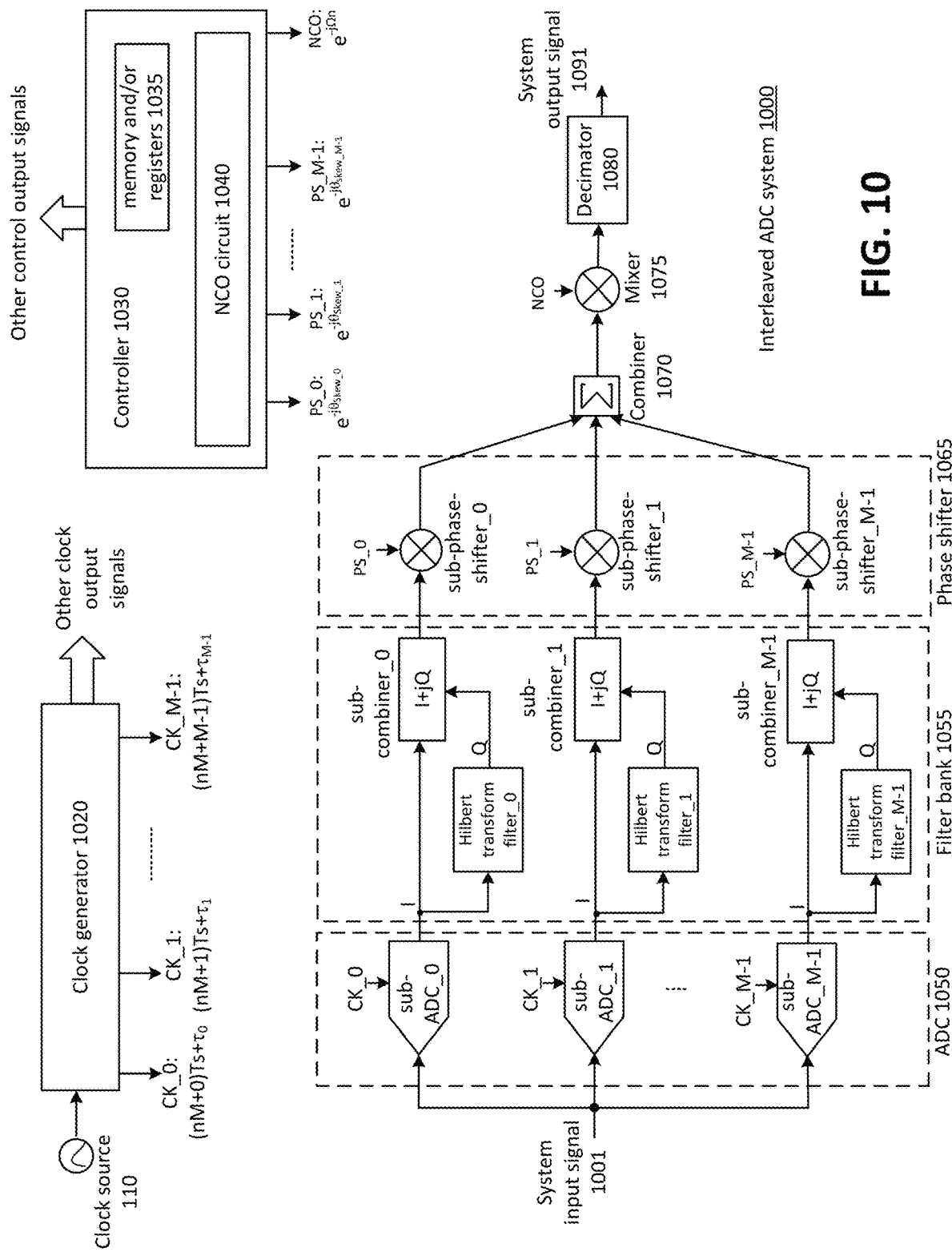
FIG. 10 illustrates another example of an interleaved ADC system.

FIG. 10 illustrates another example of an interleaved ADC system.

In FIG. 10, an interleaved ADC system 1000 may include an ADC_1050, a filter bank 1055, and a phase shifter 1065. The ADC_1050 may include sub-ADCs (e.g., sub-ADC_0, sub-ADC_1, . . . , and sub-ADC_M−1). The sub-ADCs may be arranged in parallel. Each sub-ADC of FIG. 10 may perform the same or similar functions and produce the same or similar output signal as a corresponding sub-ADC of FIG. 1. Each sub-ADC of FIG. 10 may produce an output signal with a timing skew error which may be represented as a timing skew value (e.g., $\tau_s$, where s=an ADC index; e.g., $\tau_0$, $\tau_1$, . . . , or $\tau_{M-1}$).

The filter bank 1055 of FIG. 10 (e.g., a Hilbert transform filter bank) may include multiple sub-filters (e.g., Hilbert transform filter 0, Hilbert transform filter 1, . . . , and Hilbert transform filter M−1) and multiple sub-combiners (e.g., sub-combiner_0, sub-combiner_1, . . . , and sub-combiner_M−1). The sub-filters and sub-combiners may be arranged in parallel. Each sub-filter of the filter bank 1055 may perform a Hilbert transform on a respective output signal (which is a real signal and shown as an "I" signal) of the respective sub-ADC and produce a corresponding imaginary signal (which is shown as a "Q" signal). Each sub-combiner (i) may receive (a) a respective real signal (from a respective sub-ADC) and (b) a respective imaginary signal (from a respective sub-filter), and (ii) may produce a combined sub-ADC output signal (which is shown as "I+jQ" in FIG. 10) associated with a respective sub-ADC. Each combined sub-ADC output signal is a complex signal. Examples of Hilbert transform operations are described above in reference to equations (3a)-(3d).

The phase shifter 1065 may include sub-phase-shifters (e.g., sub-phase-shifter 0, sub-phase-shifter_1, . . . , and sub-phase-shifter M−1). The sub-phase-shifters may be arranged in parallel. Each sub-phase-shifter may be coupled to a respective sub-ADC via a respective sub-combiner. Each sub-phase-shifter (i) may receive (a) a representation of a respective phase skew value (e.g., $e^{-j\theta skew\_s}$; e.g., $e^{-j\theta Skew\_0}$, $e^{-j\theta Skew\_1}$, . . . , or $e^{-j\theta skew\_M-1}$) and (b) a combined sub-ADC output signal associated with the respective sub-ADC, and (ii) may provide a respective sub-phase-shifter output signal with phase compensation. In one or more examples, each sub-phase-shifter may multiply an input signal (e.g., a combined sub-ADC output signal associated with the respective sub-ADC) with a multiplication factor (e.g., a representation of a respective phase skew value (e.g., $e^{-j\theta skew\_s}$), where $\theta_{skew\_s}$ is a phase shifting amount, to produce a respective sub-phase-shifter output signal. The multiplication factor relates to a phase and is not associated with a frequency component or a frequency value. Each respective sub-phase-shifter output signal has its phase shifted by its respective phase shifting amount (e.g., $\theta_{skew\_s}$). In one or more examples, each sub-phase-shifter shifts a phase of its input signal without changing or shifting a frequency of its input signal.

Each sub-phase-shifter uses a representation of a respective phase skew value and corrects, in a phase domain, the respective timing skew error (or the respective timing skew value) (e.g., $\tau_0$, $\tau_1$, . . . , $\tau_{M-1}$) associated with a respective sub-ADC, where the timing skew error or value is in a time domain.

The interleaved ADC system 1000 may also include a controller 1030, which may include an NCO circuit 1040. The controller 1030 (or the NCO circuit 1040) may determine each phase skew value and provide a representation of the phase skew value to a respective sub-phase-shifter. In one or more examples, the controller 1030 (or the NCO circuit 1040) may determine and provide a respective phase shift value (e.g., PS_0, PS_1, . . . , or PS_M−1) for each sub-phase-shifter, and a representation of a respective phase skew value includes, or is, a phase shift value. Each sub-phase-shifter shifts a phase of its input signal without changing or shifting a frequency of its input signal; hence, none of the sub-phase-shifters requires a frequency component or a frequency value. Accordingly, determining and generating the phase shift values do not require the use of an oscillator (e.g., an NCO) and do not require a frequency component or a frequency value. In one or more examples, none of the phase shift values contains a frequency component or a frequency value. In one or more examples, none of the phase shift values is based on a frequency component or a frequency value.

Furthermore, the interleaved ADC system 1000 may include a clock generator 1020 (e.g., a multiphase clock generator) which may be the same or similar to the clock generator 120. The clock generator 1020 may provide clock signals to the ADC_1050, to the controller 1030 and to other components shown in FIG. 10. The controller 1030 may include one or more controllers. A controller may include one or more processors or microprocessors. The interleaved ADC system 1000 may also include a combiner_1070, a mixer 1075, and a decimator 1080. The combiner 1070 may combine the interleaved output signals of the sub-phase-shifters to produce a combined signal.

The mixer 1075 may mix the combined signal with an NCO value (e.g., NCO, which may be $e^{-j\Omega n}$) and produce a down-converted signal. The NCO may be an ideal NCO value. In one or more examples, the mixer 1075 mixes its input signal (e.g., the combined signal) with a frequency shifting value (e.g., an NCO value) to shift the frequency of the combined signal. The output signal of the mixer 1075 is the combined signal with its frequency shifted based on the NCO value. The mixer 1075 may thus function as a down-converter or a frequency shifter. The decimator 1080 may downsample the down-converted signal outputted by the mixer 1075 and produce a system output signal 1091, which is a digital signal.

Figure 11:
FIG. 11 illustrates an example method for correcting timing skew errors using phase compensation.

FIG. 11 illustrates an example method for an interleaved ADC system (e.g., 100 in FIG. 1) relating to having timing skew values in a time domain and correcting the same using phase compensation (e.g., using phase skew values in a phase domain). The method may include receiving, by each sub-ADC, a system input signal and a respective clock signal, wherein the respective clock signal is delayed by a respective ADC sampling delay value, and wherein the respective clock signal is associated with a representation of a respective timing skew value (step 1110). Each sub-ADC may produce a respective sub-ADC output signal (step 1120). Each sub-mixer may receive the respective sub-ADC output signal and a representation of a respective phase skew value (step 1130) and may produce a respective sub-mixer output signal, which is a down-converted signal with phase compensation (step 1140). A combiner (e.g., 170) may combine the sub-mixer output signals and generate a combined output signal (step 1150). A decimator (e.g., 180) may then decimate the combined output signal to generate a system output signal 191 (step 1160).

FIG. 12 illustrates another example method for an interleaved ADC system (e.g., 1000 in FIG. 10) relating to having timing skew values in a time domain and correcting the same using phase compensation (e.g., using phase skew values in a phase domain). The method may include receiving, by each sub-ADC, a system input signal and a respective clock signal and producing, by each sub-ADC, a respective sub-ADC output signal, wherein the respective clock signal is delayed by a respective ADC sampling delay value, and wherein the respective clock signal is associated with a representation of a respective timing skew value (step 1210). A sub-filter may determine and produce a respective imaginary sub-ADC output signal, and a sub-combiner may determine and produce a respective combined sub-ADC output signal (step 1220).

Each sub-phase-shifter may receive the respective combined sub-ADC output signal and a representation of a respective phase skew value and may determine and produce a respective sub-phase-shifter output signal (step 1230). A combiner (e.g., 1070) may combine the sub-phase-shifter output signals and generate a combined signal (step 1240). A mixer (e.g., 1075) may receive the combined signal and produce a down-converted output signal (step 1250). A decimator (e.g., 1080) may then decimate the down-converted output signal to generate a system out signal 1091 (step 1260).

In one or more aspects, the interleaved ADC system 100 of FIG. 1 is more advantageous than the interleaved ADC system 1000 of FIG. 10. In one aspect, the interleaved ADC system 100 provides a phase compensation that is integrated with a digital down conversion. In FIG. 1, the controller 130 (or the NCO circuit 140) may include and utilize one or more NCOs to produce the compensated NCO values and provide the compensated NCO values to the sub-mixers. Each compensated NCO value contains a frequency component (e.g., $e^{-j\Omega(nM+s)}$) and a phase component (e.g., $e^{-j\theta Skew\_s}$) Each sub-mixer may receive a respective compensated NCO value that has both a frequency component (for digital down conversion) and a phase component (for phase compensation). In one aspect, unlike the interleaved ADC system 1000 of FIG. 10, the interleaved ADC system 100 of FIG. 1 is implemented without a filter bank 1055 (e.g., without Hilbert transform filters and sub-combiners), and the interleave ADC system 100 does not require the functionality or operations of the filter bank 1055 or its components. In another aspect, while the interleaved ADC system 1000 of FIG. 10 performs a phase compensation (e.g., by the phase-shifter 1065) separately from performing a digital down conversion (e.g., by the mixer 1075), the interleaved ADC system 100 of FIG. 1 performs a phase compensation that is integrated with a digital down conversion by the same component (e.g., by the mixer 160, or by each respective sub-mixer of the mixer 160). In one or more aspects, the interleaved ADC system 100 is more cost efficient in its hardware implementation than the interleaved ADC system 1000.

In one or more examples, without limiting the scope of the subject technology, the following values or ranges may be utilized. An example of a sampling rate or a sampling frequency ($f_s$) may be a value between 1 GSPS and 128 GSPS. An example of a frequency of a system input signal ($f_{in}$) may be a value between 1 GHz and 50 GHz. An example of a carrier frequency or a center frequency ($f_c$) of $f_{in}$ (where $f_{in}$ is a modulated signal) may be a value between 1 GHz and 50 GHz. An example of a channel bandwidth ($f_{bw}$) may be a value between 20 MHz and 3 GHz. An example of an ADC interleaving factor (M) may be a power of 2 (or $2^n$), where n may be 2, 3, 4, 5, 6, or 7. An example of M is 16, 32, 64 or 128.

In one or more examples, a decimation factor of a decimator (e.g., 180, 1080) may be the same as M. In one or more other examples, a decimation factor of a decimator (e.g., 180, 1080) may be equal to or less than M (e.g., a value between M and ½ of M). In one or more other examples, a decimation factor may be equal to or greater than ½ of M. In one example, if M=16, then a decimation factor may be equal to or greater than 8. If M=64, then a decimation factor may be equal to or greater than 32.

In one or more examples, the total number of sub-ADCs may be the same as M, as shown in FIGS. 1 and 10. In one or more other examples, the total number of sub-ADCs may be equal to or more than M (e.g., a number between M and 4*M).

In one or more examples, the total number of sub-mixers (e.g., a set of sub-mixer_0, sub-mixer_1, . . . , and sub-mixer_M−1) may be the same as M, as shown in FIG. 1. In one or more examples, the total number of sub-phase-shifters (e.g., a set of sub-phase-shifter_0, sub-phase-shifter_1, . . . , and sub-phase-shifter M−1) may be the same as M, as shown in FIG. 10. In one or more examples, the total number of sub-ADCs may be the same as the total number of sub-mixers, as shown in FIG. 1. In one or more examples, the total number of sub-ADCs may be the same as the total number of sub-phase-shifters, as shown in FIG. 10. In one or more other examples, the total number of sub-ADCs may be equal to or less than the total number of sub-mixers (e.g., a number between (i) the total number of sub-mixers and (ii) a half of the total number of sub-mixers). In one or more other examples, the total number of sub-ADCs may be equal to or less than the total number of sub-phase-shifters (e.g., a number between (i) the total number of sub-phase-shifters and (ii) a half of the total number of sub-phase-shifters).

A timing skew value (e.g., $\tau_s$; e.g., $\tau_0, \tau_1, \ldots,$ or $T_{M-1}$) may be a real number, and it may be a positive number or a negative number. A timing skew value may be, for example, +/−2% of Ts. As an illustration, if a sampling rate or a sampling frequency ($f_s$) is 64 GSPS, then Ts (which is $1/f_s$) is about 15 picoseconds, and +/−2% of 15 picoseconds is about +/−300 femtoseconds. Hence, in this example, a timing skew value may be +/−300 femtoseconds. As another illustration, if $f_s$ is between 1 GSPS and 128 GSPS, a timing skew value can be between +/−20 picoseconds and +/−150 femtoseconds, respectively.

In one or more implementations, a phase skew value for each sub-mixer (e.g., $\theta_{Skew\_s}$; e.g., $\theta Skew\_0, \theta_{skew\_1}, \ldots,$ or $\theta_{Skew\_m-1}$ for a sub-mixer in FIG. 1) may be a value that is greater than 0 degree but not exceeding 2 degrees (or 2*π/180=0.035 radians). In one or more implementations, a phase skew value for each sub-phase-shifter (e.g., $\theta_{Skew\_s}$; e.g., $\theta_{Skew\_0}$, $\theta_{Skew\_1}$, . . . , or $\theta_{Skew\_M-1}$ for a sub-phase-shifter in FIG. 10) may be a value that is greater than 0 degree but not exceeding 2 degrees (or 2*π/180=0.035 radians). In one or more other implementations, a phase skew value (e.g., a phase skew value for each sub-mixer; a phase skew value for each sub-phase-shifter) may be a value that is greater than 0 degree but not exceeding 3 degrees (or 3*π/180=about 0.052 radians). In one or more other implementations, a phase skew value (e.g., a phase skew value for each sub-mixer; a phase skew value for each sub-phase-shifter) may be a value that is greater than 0 degree but not exceeding 6 degrees (or 6*π/180=about 0.11 radians). The values and ranges described herein are examples and do not limit the scope of the subject technology. The subject technology may utilize other values and ranges.

In one or more implementations, a system input signal (e.g., 101 and 1001) is an analog signal. In one example, a system input signal is a continuous wave signal having a single frequency. In another example, a system input signal is a modulated signal having a center frequency ($f_c$) and a chancel bandwidth ($f_{bw}$).

In one or more implementations, the output signals of the sub-ADCs (e.g., sub-ADC_0, sub-ADC_1, . . . , and sub-ADC_M−1), the sub-mixers (e.g., sub-mixer_0, sub-mixer_1, . . . , and sub-mixer_M−1), the combiner 170 and the decimator 180 of FIG. 1 are digital signals. In one or more examples, the portions of the ADC 150 that perform sampling of the system input signal and thereafter, the mixer 160, the combiner 170 and the decimator 180 of FIG. 1 operate in a digital domain.

In one or more implementations, the output signals of the sub-ADCs (e.g., sub-ADC_0, sub-ADC_1, . . . , and sub-ADC_M−1), the sub-combiners (e.g., sub-combiner_0, sub-combiner_1, . . . , and sub-combiner_M−1), and the sub-phase-shifters (e.g., sub-phase-shifter_0, sub-phase-shifter_1, . . . , and sub-phase-shifter M−1), the combiner 1070, the mixer 1075, and the decimator 1080 of FIG. 10 are digital signals. In one or more examples, the portions of the ADC_1050 that perform sampling of the system input signal and thereafter, the filter bank 1055, the phase shifter_1065, the combiner 1070, the mixer 1075 and the decimator 1080 of FIG. 10 operate in a digital domain.

In one or more implementations, an interleaved ADC system may have timing skew errors (or timing skew values) in a time domain, and the interleaved ADC system may correct or compensate the timing skew errors or values using phase compensation in a phase domain. In one or more implementations, the interleaved ADC system does not correct or compensate, in a time domain, the timing skew errors or values that are in a time domain. In one or more implementations, the interleaved ADC system does not correct or compensate, in an analog domain, the timing skew errors or values that are in a time domain. In one or more implementations, the interleaved ADC system does not directly adjust or correct the sampling clock (e.g., the clock signals for the sub-ADCs; e.g., CK_0, CK_1, . . . , and CK_M−1). In one or more implementations, the interleaved ADC system does not use a test signal (or a reference signal) to compensate for the timing skew errors. In one or more implementations, the interleaved ADC system does not use the clock generator, the sub-ADCs or the components thereof to compensate for the timing skew errors. In one or more implementations, the interleaved ADC system does not use the combiner to compensate for the timing skew errors. In one or more implementations, the interleaved ADC system uses phase compensation only in a phase domain, to correct the timing skew errors that occur in a time domain. In one or more implementations, the phase compensation is performed only in sub-mixers (e.g., sub-mixer_0, sub-mixer_1, . . . , and sub-mixer_M−1 as shown in FIG. 1). In one or more implementations, the phase compensation is performed only in sub-phase-shifters (e.g., sub-phase-shifter_0, sub-phase-shifter_1, . . . , and sub-phase-shifter M−1 as shown in FIG. 10). In one or more examples, the sub-mixers (e.g., sub-mixer_0, sub-mixer_1, . . . , and sub-mixer_M−1 as shown in FIG. 1) may be located between the sub-ADCs and a combiner (e.g., 170). In one or more examples, the sub-phase-shifters (e.g., sub-phase-shifter_0, sub-phase-shifter_1, . . . , and sub-phase-shifter M−1 as shown in FIG. 10) may be located between the sub-ADCs and a combiner (e.g., 10170). In one or more implementations, the phase compensation is performed using NCO values. Each NCO value is determined based on a respective phase skew value. A controller (e.g., 130, 1030) or an NCO circuit (e.g., 140, 1040) may determine phase skew values and the NCO values.

In one or more implementations, the timing skew errors (or timing skew values) may be produced in the ADC (e.g., ADC 150 or 1050) or may be produced in the output signals of the ADC (or the sub-ADCs). A clock generator (e.g., 120 and 1020) may generate a clock signal for a respective sub-ADC. To show the timing skew errors occurring in the ADC, in one aspect, a respective clock signal for each sub-ADC may be represented as being shifted by a respective timing skew value (e.g., $\tau_s$; e.g., $\tau_0$, $\tau_1$, . . . , or $\tau_{M-1}$). In another aspect, a respective clock signal for each sub-ADC is for being represented as a clock signal delayed by a respective timing skew value. In another aspect, a respective clock signal for each sub-ADC is associated with a representation of a respective timing skew value.

In one or more implementations, in addition to the memory and/or registers 135 and 1035, an interleaved ADC system may include other memories and/or registers. These may reside in a clock generator (e.g., 120, 1020), in an NCO circuit (e.g., 40, 1040), in other components shown in FIG. 1 or FIG. 10, in other locations within the interleaved ADC system or elsewhere. The memories and/or registers may store various values and look-up tables described herein.

Various examples of aspects of the disclosure are described below as clauses for convenience. These are provided as examples, and do not limit the subject technology. As an example, some of the clauses described below are illustrated with respect to FIGS. 1, 6, 10, 11 and 12.

In accordance with one or more implementations, an example clause includes an interleaved analog-to-digital converter (ADC) system (e.g., 100 in FIG. 1), comprising: an ADC (e.g., 150) comprising sub-ADCs arranged in parallel, wherein each sub-ADC of the ADC is configured to receive a system input signal (e.g., 101), configured to receive a respective clock signal (e.g., CK_0, CK_1, . . . , or CK_M−1) and configured to produce a respective sub-ADC output signal (at an output of a respective sub-ADC) that represents a digital signal, wherein the respective clock signal for each sub-ADC of the ADC is delayed by a respective ADC sampling delay value (e.g., $\tau_0$, $\tau_1$, . . . , or $\tau_{M-1}$), and wherein the respective clock signal for each sub-ADC of the ADC is associated with a representation of a respective timing skew value (e.g., $\tau_0$, $\tau_1$, . . . , or $\tau_{M-1}$); a digital mixer (e.g., 160) coupled to the ADC, the digital mixer comprising sub-mixers arranged in parallel, wherein each sub-mixer of the digital mixer is configured to receive the respective sub-ADC output signal, configured to receive a respective compensated numerically controlled oscillator (NCO) value (e.g., NCO_0, NCO_1, . . . , or NCO_M−1; e.g., $e^{-j(\Omega(nM+S)\theta_{Skew\_s})}$), and configured to produce a respective sub-mixer output signal that represents a down-converted signal of the respective sub-ADC output signal; and a combiner (e.g., 170) coupled to the digital mixer, wherein the combiner is configured to combine the sub-mixer output signals and configured to produce a combined output signal, wherein: for each sub-ADC of the ADC, the respective timing skew value reflects an undesired timing error at the respective sub-ADC; each timing skew value is a value in time; for each sub-mixer of the digital mixer, the respective compensated NCO value is determined using a respective phase skew value (e.g., $\theta_{Skew\_s}$); each phase skew value is an offset value in phase and is not a value in time; each phase skew value is determined based on the respective timing skew value; and the respective phase skew value in a phase domain is for compensating the respective timing skew value in a time domain.

Any of the clauses, comprising a controller (e.g., 130, 140), wherein: the controller is configured to cause determining, for each sub-mixer of the digital mixer, the respective phase skew value, based on a frequency of the system input signal and the respective timing skew value; the digital mixer is configured to use the compensated NCO values in the phase domain, to compensate for timing skew errors occurring in the time domain at the ADC, without performing, in the time domain, correction of the timing skew errors; and the interleaved ADC system is configured to compensate the timing skew errors without providing the phase skew values to the ADC, without having the ADC compensate for the timing skew errors occurring at the ADC, and without having a clock generator compensate for the timing skew errors.

Any of the clauses, comprising a controller, wherein the controller is configured to cause: determining, for each sub-ADC of the ADC, a respective ideal NCO value (e.g., $e^{-j\Omega(nM+s)}$), wherein the respective ideal NCO value is not based on a phase skew value; and determining, for each sub-ADC of the ADC, the respective compensated NCO value based on the determined respective ideal NCO value and the respective phase skew value.

Any of the clauses, wherein: the controller is configured to cause determining and storing a set of ideal NCO values before the sub-ADCs receive the system input signal; the controller is configured to cause determining the compensated NCO values in real time after the sub-ADCs receive the system input signal.

Any of the clauses, wherein: before the sub-ADCs receive the system input signal, the controller is configured to cause determining a set of ideal NCO values using a look-up table for a single quadrant only (see, e.g., FIGS. 6A-6C) and storing the set of ideal NCO values in a memory or registers of the interleaved ADC system; and after the sub-ADCs receive the system input signal: when the respective ideal NCO value is within the single quadrant, the controller is configured to cause reading the respective ideal NCO value from the stored set of ideal NCO values; and when the respective ideal NCO value is within one of remaining three quadrants, the controller is configured to cause computing the respective ideal NCO value in real time based on a corresponding ideal NCO read from the stored set of ideal NCO values.

Any of the clauses, comprising a controller, wherein: when the system input signal is a modulated signal having a carrier frequency and a channel bandwidth, the timing skew values are computed timing skew values; the controller is configured to determine the computed timing skew values based on (see, e.g., the second method including steps (a)-(c)): selecting a frequency of the system input signal, wherein the selected frequency satisfies coherent sampling, the selected frequency is within the channel bandwidth of the carrier frequency, and the selected frequency does not overlap with any frequencies for being occupied by spurs produced by the ADC for the modulated signal; determining spurs to be produced by the ADC for the selected frequency; performing discrete Fourier transforms on the spurs and the selected frequency to produce output values; and determining the computed timing skew values using the output values; and each of the timing skew values corresponds to the respective computed timing skew value.

Any of the clauses, wherein for each sub-mixer of the digital mixer, the controller is configured to cause: determining the respective phase skew value, based on the selected frequency of the system input signal and the respective computed timing skew value (see, e.g., $\theta_{Skew\_s} = 2\pi \ast f_{in} \ast \tau_s$).

Any of the clauses, wherein the controller is configured to determine the computed timing skew values in real time after the ADC receives the system input signal.

Any of the clauses, wherein: for each sub-ADC of the ADC, the respective timing skew value is a predetermined value that estimates the undesired timing error for being produced at the respective sub-ADC; and each timing skew value is predetermined before the ADC receives the system input signal.

Any of the clauses, comprising a controller and a decimator (e.g., 180), wherein for each sub-mixer of the digital mixer, the controller is configured to cause: determining the respective phase skew value in real time after the ADC receives the system input signal, and wherein clock signals for the sub-ADCs, the sub-mixers, the combiner, the decimator and the controller are for being derived from a single clock source.

Any of the clauses, wherein for each sub-mixer of the digital mixer: the respective compensated NCO value is determined as $e^{-j(\Omega(nM+s)+\theta_{Skew\_s})}$, where: $e^{-j\Omega(nM+s)}$=an ideal NCO value; $e^{-j\theta_{Skew\_s}}$=an NCO value portion derived from the respective phase skew value $$\Omega = \frac{2\pi f_{in}}{f_s};$$

$f_{in}$=a frequency of the system input signal; $f_s$=a sampling rate; n=a time index that is a non-negative integer; M= an ADC interleaving factor that is a non-negative integer; s=an ADC index that is a non-negative integer; and $\theta_{Skew\_s}$=the respective phase skew value.

Any of the clauses, wherein: each respective compensated NCO value comprises a respective frequency component and a respective phase component; each respective sub-mixer is configured to use the respective frequency component to down-convert the respective sub-ADC output signal and configured to use the respective phase component to provide a respective phase compensation for compensating the respective timing skew value; and each respective phase component comprises a representation of the respective phase skew value.

Any of the clauses, comprising a controller, wherein: the controller comprises one or more NCOs to be used for providing the frequency components of the compensated NCO values.

Any of the clauses, wherein each respective sub-mixer is configured to concurrently (i) down-convert the respective sub-ADC output signal and (ii) provide the respective phase compensation.

Any of the clauses, wherein each respective sub-mixer is configured to digitally down-convert the respective sub-ADC output signal and provide the respective phase compensation in a digital domain.

In accordance with one or more implementations, an example clause includes a method (e.g., FIG. 11) for an interleaved analog-to-digital converter (ADC) system (e.g., 100) comprising an ADC (e.g., 150) and a digital mixer (e.g., 160), the ADC comprising sub-ADCs, the digital mixer (e.g., 160) comprising sub-mixers, the method comprising: receiving, by each sub-ADC, a system input signal (e.g., 101) and a respective clock signal (e.g., CK_0, CK_1, ..., or CK_M−1), wherein the respective clock signal is delayed by a respective ADC sampling delay value (e.g., 0, Ts, ..., or (M−1)Ts), and wherein the respective clock signal is associated with a representation of a respective timing skew value (e.g., Ts) (e.g., 1110); producing, by each sub-ADC, a respective sub-ADC output signal (e.g., 1120); receiving, by each sub-mixer, the respective sub-ADC output signal and a representation of a respective phase skew value (e.g., $e^{-j\theta_{skew\_s}}$; e.g., $e^{-j\theta_{Skew\_0}}$, $e^{-j\theta_{Skew\_1}}$, ..., or $e^{-j\theta_{skew\_M-1}}$) (e.g., 1130); and producing, by each sub-mixer, a respective sub-mixer output signal (e.g., 1140), wherein: for each sub-ADC, the respective timing skew value reflects an undesired timing error at the respective sub-ADC; each timing skew value is a value in time; each phase skew value is an offset value in phase and is not a value in time; each phase skew value is determined based on the respective timing skew value; and the respective phase skew value in a phase domain is for compensating the respective timing skew value in a time domain.

Any of the clauses, comprising: determining, for each sub-mixer, the respective phase skew value, based on a frequency of the system input signal and the respective timing skew value, wherein: the representation of the respective phase skew value comprises a compensated numerically controller oscillator (NCO) value in the phase domain; each compensated NCO value (e.g., NCO_0, NCO_1, ..., or NCO_M−1; e.g., $e^{-j(\Omega(nM+s)+\theta_{Skew\_s})}$) is determined based on the respective phase skew value (e.g., $\theta_{Skew\_s}$); and the compensated NCO values in the phase domain, determined based on the phase skew values, are used to compensate for timing skew errors occurring in the time domain at the ADC, wherein the timing skew errors are not corrected in the time domain.

Any of the clauses, wherein: a compensated numerically controller oscillator (NCO) value in the phase domain is the representation of the respective phase skew value; and the method comprises: determining, for each sub-ADC, a respective ideal NCO value, wherein the respective ideal NCO value is not based on a phase skew value; and determining, for each sub-ADC, the respective compensated NCO value based on the determined respective ideal NCO value and the respective phase skew value.

Any of the clauses, wherein: a set of ideal NCO values are determined and stored in the interleaved ADC system prior to receiving the system input signal by the ADC; and the determining of the compensated NCO values is performed in real time after receiving the system input signal by the ADC.

Any of the clauses, wherein: a set of ideal NCO values are determined using a look-up table for a single quadrant only and stored in the interleaved ADC system prior to receiving the system input signal by the ADC; and after receiving the system input signal by the ADC: when the respective ideal NCO value is within the single quadrant, the respective ideal NCO value is read in real time from the stored set of ideal NCO values; and when the respective ideal NCO value is within one of remaining three quadrants, the respective ideal NCO value is computed in real time based on a corresponding ideal NCO read from the stored set of ideal NCO values.

Any of the clauses, wherein: when the system input signal is a modulated signal having a carrier frequency and a channel bandwidth, the timing skew values are computed timing skew values; the computed timing skew values are determined based on: selecting a frequency of the system input signal, wherein the selected frequency satisfies coherent sampling, the selected frequency is within the channel bandwidth of the carrier frequency, and the selected frequency does not overlap with any frequencies for being occupied by spurs produced by the ADC for the modulated signal; determining spurs to be produced by the ADC for the selected frequency; performing discrete Fourier transforms on the spurs and the selected frequency to produce output values; and determining the computed timing skew values using the output values; and each of the timing skew values corresponds to the respective computed timing skew value.

Any of the clauses, comprising: for each sub-mixer, determining the respective phase skew value, based on the selected frequency of the system input signal and the respective computed timing skew value.

In accordance with one or more implementations, an example clause includes an interleaved analog-to-digital converter (ADC) system (e.g., 1000 of FIG. 10), comprising: an ADC (e.g., 1050) comprising sub-ADCs, wherein each sub-ADC of the ADC is configured to receive a system input signal (e.g., 1001), configured to receive a respective clock signal (e.g., CK_0, CK_1, ..., or CK_M−1) and configured to produce a respective sub-ADC output signal, wherein the respective clock signal for each sub-ADC is delayed by a respective ADC sampling delay value (e.g., 0, Ts, ..., or (M−1)Ts), and wherein the respective clock signal for each sub-ADC is associated with a representation of a respective timing skew value (e.g., $\tau_s, \tau_1, \ldots,$ or $\tau_{M-1}$); a filter bank (e.g., 1055) comprising sub-filters (e.g., Hilbert transform filter 0, Hilbert transform filter 1, ..., and Hilbert transform filter M−1) and sub-combiners (e.g., sub-combiner_0, sub-combiner_1, ..., and sub-combiner_M−1), wherein each sub-filter of the filter bank is configured to receive the respective sub-ADC output signal and configured to produce a respective imaginary sub-ADC output signal, and wherein each sub-combiner of the filter bank is configured to combine the respective sub-ADC output signal and the respective imaginary sub-ADC output signal and configured to produce a respective combined sub-ADC output signal; a phase shifter (e.g., 1065) comprising sub-phase-shifters, wherein each sub-phase-shifter of the phase shifter is configured to receive the respective combined sub-ADC output signal and a representation of a respective phase skew value (e.g., $e^{-j\theta_{skew\_s}}$; e.g., $e^{-j\theta_{Skew\_0}}$, $e^{-j\theta_{Skew\_1}}$, ..., or $e^{-j\theta_{skew\_M-1}}$) in a phase domain, and configured to produce a respective sub-phase-shifter output signal; a combiner (e.g., 1070) configured to combine the sub-phase-shifter output signals and configured to produce a combined signal; and a mixer (e.g., 1075) configured to receive the combined signal and configured to produce a down-converted output signal, wherein: for each sub-ADC, the respective timing skew value reflects a timing error; each timing skew value is a value in time; each phase skew value is an offset value in phase and is not a value in time; each phase skew value is determined based on the respective timing skew value; and the respective phase skew value in the phase domain is for compensating the respective timing skew value in a time domain of the respective sub-ADC.

Any of the clauses, comprising a controller, wherein: each sub-filter of the filter bank is a Hilbert transform filter; the controller is configured to generate a respective phase shift value for the respective sub-phase-shifter; the respective phase shift value is generated based on the respective phase skew value; the representation of the respective phase skew value comprises the respective phase shift value; the controller is configured to generate a numerically controlled oscillator (NCO) value and configured to provide the NCO value to the mixer; and the mixer is configured to receive the NCO value and configured to mix the NCO value with the combined signal to produce the down-converted output signal.

In one or more aspects, examples of additional clauses are described as follows. A method comprising one or more methods, operations or portions thereof described herein. An apparatus comprising one or more memories or registers (e.g., 135, 1035) and one or more controllers (e.g., 130, 140, 1030, 1040), the one or more controllers configured to cause performing one or more methods, operations or portions thereof described herein. An apparatus comprising means (e.g., 100, 1000, components thereof) adapted for performing one or more methods, operations or portions thereof described herein. A processor (e.g., 130, 140, 1030, 1040) comprising modules for carrying out one or more methods, operations or portions thereof described herein. A hardware apparatus comprising circuits (e.g., 100, 1000, components thereof) configured to perform one or more methods, operations or portions thereof described herein.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims in this subject disclosure. In one aspect, a clause may depend from any other clauses, sentences or phrases in this subject disclosure.

To illustrate the interchangeability of hardware and software, items such as the various illustrative blocks, modules, components, methods, operations, instructions, and algorithms have been described generally in terms of their functionality. Whether such functionality is implemented as hardware, software (or firmware) or a combination of hardware and software (or firmware) depends upon the particular application and design constraints imposed on the overall system. Skilled artisans may implement the described functionality in varying ways for each particular application.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements. Furthermore, while the subject disclosure provides many example values for various parameters (e.g., $f_s$, $f_{in}$, $f_c$, $f_{bw}$, M, a decimation factor, the number of sub-ADCs, the number of sub-mixers, the number of sub-phase-shifters, phase skew values, and timing skew values, etc.), these are non-limiting examples, and other values and ranges are within the scope of the subject technology.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

In one aspect, the blocks or components described in this present disclosure (e.g., components in FIGS. 1, 6 and 10) may be implemented in circuits and integrated circuits including transistors, such as (i) one or more bipolar junction transistors (BJTs), which may refer to any of a variety of multi-terminal transistors generally operating on the principal of carrying current using both electrons and holes, including but not limited to an n-p-n BJT and a p-n-p BJT, (ii) one or more field effect transistors (FETs), which may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET). Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order.

Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. An interleaved analog-to-digital converter (ADC) system, comprising:
    an ADC comprising sub-ADCs arranged in parallel, wherein each sub-ADC of the ADC is configured to receive a system input signal, configured to receive a respective clock signal and configured to produce a respective sub-ADC output signal that represents a digital signal, wherein the respective clock signal for each sub-ADC of the ADC is delayed by a respective ADC sampling delay value, and wherein the respective clock signal for each sub-ADC of the ADC is associated with a representation of a respective timing skew value;
    a digital mixer coupled to the ADC, the digital mixer comprising sub-mixers arranged in parallel, wherein each sub-mixer of the digital mixer is configured to receive the respective sub-ADC output signal, configured to receive a respective compensated numerically controlled oscillator (NCO) value, and configured to produce a respective sub-mixer output signal that represents a down-converted signal of the respective sub-ADC output signal;
    a combiner coupled to the digital mixer, wherein the combiner is configured to combine the sub-mixer output signals and configured to produce a combined output signal; and
    a controller configured to cause:
    determining and storing a set of ideal NCO values before the sub-ADCs receive the system input signal; and
    determining the compensated NCO values in real time after the sub-ADCs receive the system input signal;
    wherein:
    for each sub-ADC of the ADC, the respective timing skew value reflects an undesired timing error at the respective sub-ADC;
    each timing skew value is a value in time;
    for each sub-mixer of the digital mixer, the respective compensated NCO value is determined using a respective phase skew value;
    each phase skew value is an offset value in phase and is not a value in time;
    each phase skew value is determined based on the respective timing skew value; and
    the respective phase skew value in a phase domain is for compensating the respective timing skew value in a time domain.

2. The interleaved ADC system of claim 1, comprising a controller, wherein:
    the controller is configured to cause determining, for each sub-mixer of the digital mixer, the respective phase skew value, based on a frequency of the system input signal and the respective timing skew value;
    the digital mixer is configured to use the compensated NCO values in the phase domain, to compensate for timing skew errors occurring in the time domain at the ADC, without performing, in the time domain, correction of the timing skew errors; and
    the interleaved ADC system is configured to compensate the timing skew errors without providing the phase skew values to the ADC, without having the ADC compensate for the timing skew errors occurring at the ADC, and without having a clock generator compensate for the timing skew errors.

3. The interleaved ADC system of claim 1, wherein the controller is configured to cause:
    determining, for each sub-ADC of the ADC, a respective ideal NCO value, wherein the respective ideal NCO value is not based on a phase skew value; and
    determining, for each sub-ADC of the ADC, the respective compensated NCO value based on the determined respective ideal NCO value and the respective phase skew value.

4. The interleaved ADC system of claim 3, wherein:
before the sub-ADCs receive the system input signal, the controller is configured to cause determining ideal NCO values using a look-up table for a single quadrant only and storing the ideal NCO values in a memory or registers of the interleaved ADC system; and
after the sub-ADCs receive the system input signal:
when the respective ideal NCO value is within the single quadrant, the controller is configured to cause reading the respective ideal NCO value from the stored ideal NCO values; and
when the respective ideal NCO value is within one of remaining three quadrants, the controller is configured to cause computing the respective ideal NCO value in real time based on a corresponding ideal NCO read from the stored ideal NCO values.

5. The interleaved ADC system of claim 1, wherein:
for each sub-ADC of the ADC, the respective timing skew value is a predetermined value that estimates the undesired timing error for being produced at the respective sub-ADC; and
each timing skew value is predetermined before the ADC receives the system input signal.

6. The interleaved ADC system of claim 1, comprising a controller and a decimator, wherein for each sub-mixer of the digital mixer, the controller is configured to cause:
determining the respective phase skew value in real time after the ADC receives the system input signal, and
wherein clock signals for the sub-ADCs, the sub-mixers, the combiner, the decimator and the controller are for being derived from a single clock source.

7. The interleaved ADC system of claim 1, wherein for each sub-mixer of the digital mixer:
the respective compensated NCO value is determined as $e^{-j(\Omega(nM+s)+\theta Skew\_s)}$,
where:
$e^{-j\Omega(nM+s)}$=an ideal NCO value;
$e^{-j\theta Skew\_s}$=an NCO value portion derived from the respective phase skew value;

$$\Omega = \frac{2\pi f_{in}}{f_s};$$

$f_{in}$=a frequency of the system input signal;
$f_s$=a sampling rate;
n=a time index that is a non-negative integer;
M= an ADC interleaving factor that is a non-negative integer;
s=an ADC index that is a non-negative integer; and
$\theta_{Skew\_s}$=the respective phase skew value.

8. The interleaved ADC system of claim 1, wherein:
each respective compensated NCO value comprises a respective frequency component and a respective phase component;
each respective sub-mixer is configured to use the respective frequency component to digitally down-convert the respective sub-ADC output signal and configured to use the respective phase component to provide a respective phase compensation in a digital domain for compensating the respective timing skew value; and
each respective phase component comprises a representation of the respective phase skew value.

9. The interleaved ADC system of claim 8, comprising a controller, wherein:
the controller comprises one or more NCOs to be used for providing the frequency components of the compensated NCO values.

10. An interleaved analog-to-digital converter (ADC) system, comprising:
an ADC comprising sub-ADCs arranged in parallel, wherein each sub-ADC of the ADC is configured to receive a system input signal, configured to receive a respective clock signal and configured to produce a respective sub-ADC output signal that represents a digital signal, wherein the respective clock signal for each sub-ADC of the ADC is delayed by a respective ADC sampling delay value, and wherein the respective clock signal for each sub-ADC of the ADC is associated with a representation of a respective timing skew value;
a digital mixer coupled to the ADC, the digital mixer comprising sub-mixers arranged in parallel, wherein each sub-mixer of the digital mixer is configured to receive the respective sub-ADC output signal, configured to receive a respective compensated numerically controlled oscillator (NCO) value, and configured to produce a respective sub-mixer output signal that represents a down-converted signal of the respective sub-ADC output signal;
a combiner coupled to the digital mixer, wherein the combiner is configured to combine the sub-mixer output signals and configured to produce a combined output signal; and
a controller,
wherein:
for each sub-ADC of the ADC, the respective timing skew value reflects an undesired timing error at the respective sub-ADC;
each timing skew value is a value in time;
for each sub-mixer of the digital mixer, the respective compensated NCO value is determined using a respective phase skew value;
each phase skew value is an offset value in phase and is not a value in time;
each phase skew value is determined based on the respective timing skew value;
the respective phase skew value in a phase domain is for compensating the respective timing skew value in a time domain;
when the system input signal is a modulated signal having a carrier frequency and a channel bandwidth, the timing skew values are computed timing skew values;
the controller is configured to determine the computed timing skew values based on:
selecting a frequency of the system input signal, wherein the selected frequency satisfies coherent sampling, the selected frequency is within the channel bandwidth of the carrier frequency, and the selected frequency does not overlap with any frequencies for being occupied by spurs produced by the ADC for the modulated signal;
determining spurs to be produced by the ADC for the selected frequency;
performing discrete Fourier transforms on the spurs and the selected frequency to produce output values; and
determining the computed timing skew values using the output values; and
each of the timing skew values corresponds to the respective computed timing skew value.

11. The interleaved ADC system of claim 10, wherein for each sub-mixer of the digital mixer, the controller is configured to cause: determining the respective phase skew value, based on the selected frequency of the system input signal and the respective computed timing skew value.

12. The interleaved ADC system of claim 11, wherein the controller is configured to determine the computed timing skew values in real time after the ADC receives the system input signal.

13. A method for an interleaved analog-to-digital converter (ADC) system comprising an ADC and a digital mixer, the ADC comprising sub-ADCs, the digital mixer comprising sub-mixers, the method comprising:
  receiving, by each sub-ADC, a system input signal and a respective clock signal, wherein the respective clock signal is delayed by a respective ADC sampling delay value, and wherein the respective clock signal is associated with a representation of a respective timing skew value;
  producing, by each sub-ADC, a respective sub-ADC output signal;
  receiving, by each sub-mixer, the respective sub-ADC output signal and a representation of a respective phase skew value; and
  producing, by each sub-mixer, a respective sub-mixer output signal,
  wherein:
  for each sub-ADC, the respective timing skew value reflects an undesired timing error at the respective sub-ADC;
  each timing skew value is a value in time;
  each phase skew value is an offset value in phase and is not a value in time;
  each phase skew value is determined based on the respective timing skew value;
  the respective phase skew value in a phase domain is for compensating the respective timing skew value in a time domain;
  a set of ideal numerically controller oscillator (NCO) values are determined and stored in the interleaved ADC system prior to receiving the system input signal by the ADC; and
  compensated NCO values are determined in real time after receiving the system input signal by the ADC.

14. The method of claim 13, comprising:
  determining, for each sub-mixer, the respective phase skew value, based on a frequency of the system input signal and the respective timing skew value,
  wherein:
  the representation of the respective phase skew value comprises a compensated numerically controller oscillator (NCO) value in the phase domain;
  each compensated NCO value is determined based on the respective phase skew value; and
  the compensated NCO values in the phase domain, determined based on the phase skew values, are used to compensate for timing skew errors occurring in the time domain at the ADC, wherein the timing skew errors are not corrected in the time domain.

15. The method of claim 13, wherein:
  a compensated NCO value in the phase domain is the representation of the respective phase skew value; and
  the method comprises:
    determining, for each sub-ADC, a respective ideal NCO value, wherein the respective ideal NCO value is not based on a phase skew value; and
    determining, for each sub-ADC, the respective compensated NCO value based on the determined respective ideal NCO value and the respective phase skew value.

16. The method of claim 15, wherein:
  ideal NCO values are determined using a look-up table for a single quadrant only and stored in the interleaved ADC system prior to receiving the system input signal by the ADC; and
  after receiving the system input signal by the ADC:
    when the respective ideal NCO value is within the single quadrant, the respective ideal NCO value is read in real time from the stored ideal NCO values; and
    when the respective ideal NCO value is within one of remaining three quadrants, the respective ideal NCO value is computed in real time based on a corresponding ideal NCO read from the stored ideal NCO values.

17. The method of claim 13, wherein:
  when the system input signal is a modulated signal having a carrier frequency and a channel bandwidth, the timing skew values are computed timing skew values;
  the computed timing skew values are determined based on:
    selecting a frequency of the system input signal, wherein the selected frequency satisfies coherent sampling, the selected frequency is within the channel bandwidth of the carrier frequency, and the selected frequency does not overlap with any frequencies for being occupied by spurs produced by the ADC for the modulated signal;
    determining spurs to be produced by the ADC for the selected frequency;
    performing discrete Fourier transforms on the spurs and the selected frequency to produce output values; and
    determining the computed timing skew values using the output values; and
  each of the timing skew values corresponds to the respective computed timing skew value.

18. The method of claim 17, comprising: for each sub-mixer, determining the respective phase skew value, based on the selected frequency of the system input signal and the respective computed timing skew value.

* * * * *